United States Patent
Katsumata et al.

(10) Patent No.: US 7,833,911 B2
(45) Date of Patent: Nov. 16, 2010

(54) METHOD OF MANUFACTURING SEMICONDUCTOR DEVICE, APPARATUS OF MANUFACTURING SEMICONDUCTOR DEVICE AND SEMICONDUCTOR DEVICE

(75) Inventors: Hiroshi Katsumata, Kanagawa-ken (JP); Katsuaki Aoki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 697 days.

(21) Appl. No.: 11/690,450

(22) Filed: Mar. 23, 2007

(65) Prior Publication Data

US 2008/0076261 A1   Mar. 27, 2008

(30) Foreign Application Priority Data

Sep. 25, 2006 (JP) .............................. 2006-258536
Mar. 19, 2007 (JP) .............................. 2007-070033

(51) Int. Cl.
*H01L 21/302* (2006.01)
*H01L 21/461* (2006.01)

(52) U.S. Cl. .................. 438/717; 438/710; 438/736; 438/737; 216/67

(58) Field of Classification Search ................ 216/79; 438/737, 736, 717; 134/1.1
See application file for complete search history.

(56) References Cited

U.S. PATENT DOCUMENTS 5,756,400 A * 5/1998 Ye et al. .................. 438/710
6,527,968 B1 * 3/2003 Wang et al. .............. 216/67

FOREIGN PATENT DOCUMENTS

| JP | 05-129246 | 5/1993 |
| JP | 2000-164582 | 6/2000 |
| KR | 2004-0074681 A | 8/2004 |

OTHER PUBLICATIONS

Korean Office action for Application No. 10-2007-005035 dated Feb. 20, 2009.

* cited by examiner

*Primary Examiner*—Roberts Culbert
(74) *Attorney, Agent, or Firm*—Pearne & Gordon LLP

(57) ABSTRACT

A method of manufacturing a semiconductor device includes: etching a first film provided on a wafer in a chamber; removing at least part of reaction products deposited on a component in the chamber facing the wafer by the etching to cause a distribution state of the deposited reaction products to get closer to a uniform state; and then etching a second film provided on the wafer in the chamber.

16 Claims, 32 Drawing Sheets

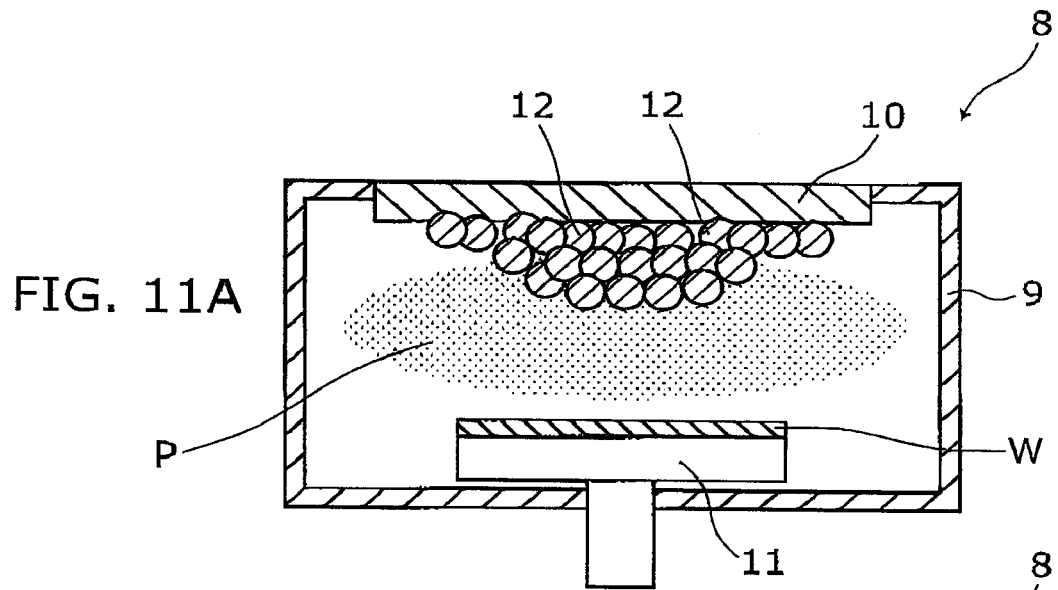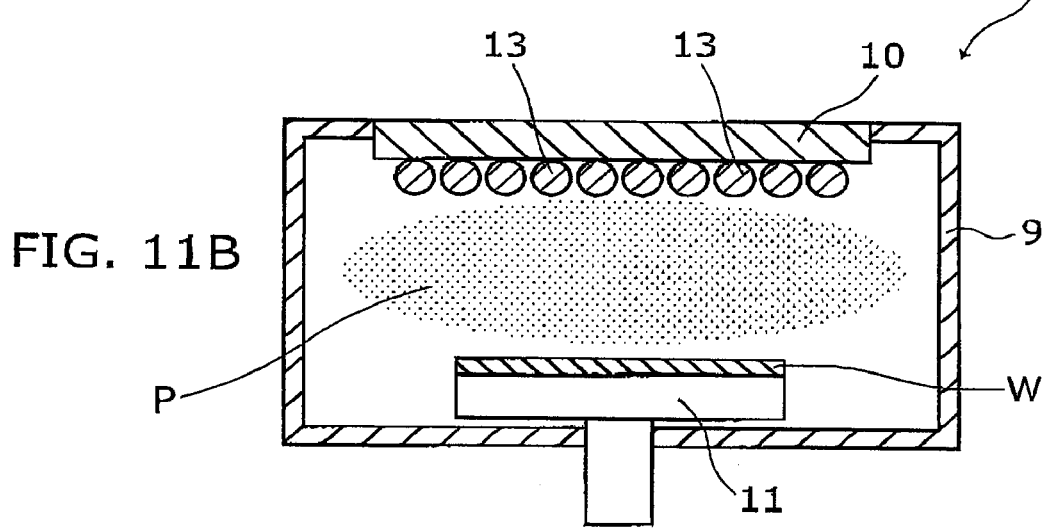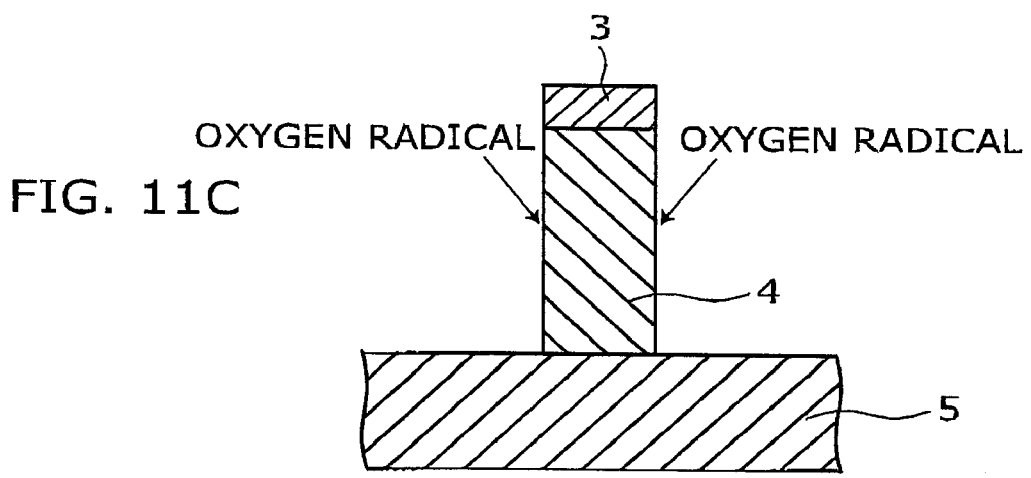

METHOD OF MANUFACTURING SEMICONDUCTOR DEVICE, APPARATUS OF MANUFACTURING SEMICONDUCTOR DEVICE AND SEMICONDUCTOR DEVICE

CROSS-REFERENCE TO RELATED APPLICATIONS

This application is based upon and claims the benefit of priorities from the prior Japanese Patent Application No. 2006-258536, filed on Sep. 25, 2006, and the prior Japanese Patent Application No. 2007-70033, filed on Mar. 19, 2007; the entire contents of which are incorporated herein by reference.

BACKGROUND OF THE INVENTION

1. Field of the Invention

The present invention relates to method of manufacturing a semiconductor device, apparatus of manufacturing a semiconductor device and semiconductor device, and in particular to method of manufacturing a semiconductor device and apparatus of manufacturing semiconductor device which are suitable to form a fine pattern accurately, and semiconductor device made by the method or apparatus.

2. Background Art

When a fine pattern of a semiconductor device is formed by dry etching, a reactive ion etching (RIE) method which is excellent in dimensional controllability is frequently used. In the reactive ion etching (RIE) method, an etching gas is decomposed and activated by plasma to generate ions and neutral active species, and a fine pattern is formed on the surface of a semiconductor wafer (hereafter "wafer") by the action of them. Volatile reaction products generated when forming the pattern are exhausted out of a chamber by an exhauster.

However, in some cases, part of the reaction products are deposited on an inner wall, electrodes, a dielectric window, etc. in the chamber without being exhausted. The deposited reaction products have a large influence on etching characteristics such as an etching rate, which becomes a cause of reducing the accuracy of line width dimensions of the pattern and the uniformity in the wafer surface of the line width dimensions. Such reduction leads to reduction in reliability of the semiconductor device as a product.

For this reason, cleaning technologies for removing deposited reaction products (see Japanese Unexamined Patent Publication No. 5-129246, for example), and technologies for changing deposited reaction products to a strong film to reduce the influence (see Japanese Patent No. 3712898, for example), etc. are proposed.

SUMMARY OF THE INVENTION

According to an aspect of the invention, there is provided a method of manufacturing a semiconductor device in which films provided on a wafer are sequentially and dry-etched in a chamber, including the steps of: etching a first film provided on the wafer; removing at least part of reaction products deposited on a component in the chamber facing the wafer by the etching to cause the distribution state of the deposited reaction products to get closer to a uniform state; and then etching a second film.

According to other aspect of the invention, there is provided a method of manufacturing a semiconductor device in which films provided on a wafer are sequentially and dry-etched in a chamber, including the step of: etching a first film provided on the wafer placed in the chamber; removing at least part of reaction products deposited in the chamber by the etching; and etching a second film provided under the first film on the wafer, information regarding an amount of the reaction products deposited in the chamber being obtained in at least any of etching the first film, removing the reaction products and etching the second film and a feedback being conducted to at least any of etching the first film, removing the reaction products and etching the second film in regard to a next wafer.

According to other aspect of the invention, there is provided a method of manufacturing a semiconductor device in which films provided on a wafer are sequentially and dry-etched in a chamber, including the step of: etching a first film provided on the wafer placed in the chamber; removing at least part of reaction products deposited in the chamber by the etching; etching a second film provided under the first film on the wafer; and etching a third film provided under the second film on the wafer, information regarding an amount of the reaction products deposited in the chamber being obtained in at least any of etching the first film, removing the reaction products and etching the second film and a feed forward being conducted to etching the third film.

According to other aspect of the invention, there is provided a method of manufacturing a semiconductor device in which films provided on a wafer are sequentially and dry-etched in a chamber, including the steps of: etching a first film provided on the wafer to form a pattern; and adjusting the size of the pattern using radicals generated from reaction products, when a mask left on the pattern is removed, the reaction products having been deposited on a component in the chamber facing the wafer by the etching.

According to other aspect of the invention, there is provided a method of manufacturing a semiconductor device in which films provided on a wafer are sequentially and dry-etched in a chamber, including the steps of: etching a first film provided on the wafer in the chamber; and removing at least part of reaction products deposited on a component in the chamber facing the wafer having been placed in the chamber to cause the distribution state of the deposited reaction products to get closer to a uniform state after the wafer has been carried out of the chamber.

According to other aspect of the invention, there is provided an apparatus of manufacturing a semiconductor device including: a chamber configured to contain a wafer; an exhausting system configured to exhaust air from the chamber; a gas supply system configured to supply the chamber with a gas; a high frequency power supply configured to form a plasma of the gas in the chamber; a wafer carrying section configured to carry the wafer into the chamber; a measuring section configured to acquire information about a reaction product accumulated in the chamber; and a control section configured to control operation of the exhausting system, gas supply system, high frequency power supply and the wafer carrying section, the control section being capable to conduct steps of: bringing the wafer carrying section into carrying the wafer into the chamber, bringing the exhausting system, the gas supply system and the high frequency power supply into etching a first film provided on a first wafer placed in a chamber; bringing the exhausting system, the gas supply system and the high frequency power supply into removing at least part of reaction products deposited in the chamber by the etching; and bringing the exhausting system, the gas supply system and the high frequency power supply into etching a second film provided under the first film on the first wafer, information regarding an amount of the reaction products deposited in the chamber being obtained by the measuring section in at least one of etching the first film, removing the reaction products and etching the second film, and a feedback being conducted to at least one of etching the first film, removing the reaction products and etching the second film in regard to a next wafer.

According to other aspect of the invention, there is provided an apparatus of manufacturing a semiconductor device including: a chamber configured to contain a wafer; an exhausting system configured to exhaust air from the chamber; a gas supply system configured to supply the chamber with a gas; a high frequency power supply configured to form a plasma of the gas in the chamber; a wafer carrying section configured to carry the wafer into the chamber; a measuring section configured to acquire information about a reaction product accumulated in the chamber; and a control section configured to control operation of the exhausting system, gas supply system, high frequency power supply and the wafer carrying section, the control section being capable to conduct steps of: bringing the wafer carrying section into carrying the wafer into the chamber, bringing the exhausting system, the gas supply system and the high frequency power supply into etching a first film provided on the wafer placed in the chamber; bringing the exhausting system, the gas supply system and the high frequency power supply into removing at least part of reaction products deposited in the chamber by the etching; bringing the exhausting system, the gas supply system and the high frequency power supply into etching a second film provided under the first film on the wafer; and bringing the exhausting system, the gas supply system and the high frequency power supply into etching a third film provided under the second film on the wafer, information regarding an amount of the reaction products deposited in the chamber being obtained by the measuring section in at least any of etching the first film, removing the reaction products and etching the second film, and a feedforward being conducted to etching the third film.

According to other aspect of the invention, there is provided a semiconductor device manufactured using a method including: etching a first film provided on a wafer in a chamber; removing at least part of reaction products deposited on a component in the chamber facing the wafer by the etching to cause a distribution state of the deposited reaction products to get closer to a uniform state; and then etching a second film provided on the wafer in the chamber.

According to other aspect of the invention, there is provided a semiconductor device manufactured using a method including: etching a first film provided on a wafer in a chamber; removing at least part of reaction products deposited in the chamber by the etching; and etching a second film provided under the first film on the wafer, information regarding an amount of the reaction products deposited in the chamber being obtained in at least one of etching the first film, removing the reaction products and etching the second film, and a feedback being conducted to at least one of etching the first film, removing the reaction products and etching the second film in regard to a next wafer, based on the information.

According to other aspect of the invention, there is provided a semiconductor device manufactured using a method including: etching a first film provided on a wafer placed in a chamber; removing at least part of reaction products deposited in the chamber by the etching; etching a second film provided under the first film on the wafer; and etching a third film provided under the second film on the wafer, information regarding an amount of the reaction products deposited in the chamber being obtained in at least one of etching the first film, removing the reaction products and etching the second film, and a feedforward being conducted to etching the third film.

According to other aspect of the invention, there is provided a semiconductor device manufactured using a method including: etching a first film provided on a wafer to form a pattern in a chamber; and adjusting size of the pattern using radicals generated from reaction products, when a mask left on the pattern is removed, the reaction products having been deposited on a component in the chamber facing the wafer by the etching.

BRIEF DESCRIPTION OF THE DRAWINGS

FIG. 11 is a schematic cross-sectional view illustrating elimination of the influence of reaction products deposited on an upper electrode after dry-etching of an oxide film.

DETAILED DESCRIPTION OF THE INVENTION

Figures 1A, 1B, 1C, 1D, 1E, 1F, 1G:
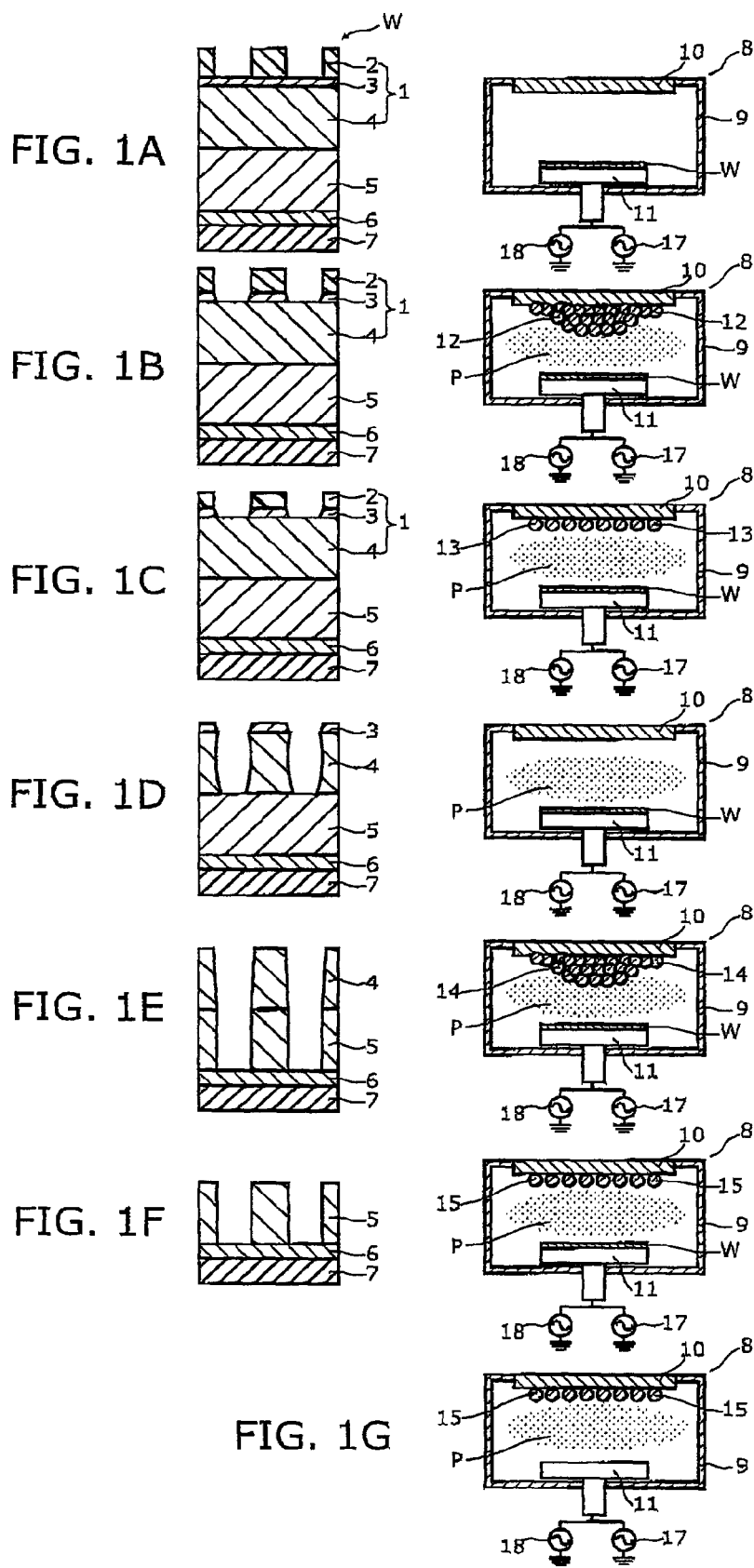
FIG. 1 shows schematic process cross-sectional views illustrating a method of manufacturing a semiconductor device according to an embodiment of the invention.

Referring to the drawings, an embodiment of the invention will be described below.

FIG. 1 shows schematic cross-sectional views illustrating a method of manufacturing a semiconductor device according to the embodiment of the invention.

Here, as an example, the case of dry-etching a wafer W having a laminated mask 1 by a reactive ion etching (RIE) apparatus 8 will be described. Dry etching using the laminated mask 1 is performed continuously in the same chamber. On the left side of FIG. 1, schematic process cross-sectional views of the wafer W having the laminated mask 1 are shown, and on the right side of FIG. 1, schematic cross-sectional views illustrating states in a chamber 9 at respective steps of the process are shown.

As shown in the left view of FIG. 1A, the laminated mask 1 includes an upper resist layer 2, an oxide film 3, and a lower resist layer 4. The upper resist layer 2 and the lower resist layer 4 include organic materials, and the oxide film 3 includes inorganic material which is, for example, silicon oxide ($SiO_x$) material such as spin-on glass (SOG). Under the laminated mask 1, an oxide film 5 including $SiO_2$ or the like is provided. This oxide film 5 is dry-etched to become lines of a pattern. Under the oxide film 5, a nitride film 6 and a polysilicon film 7 which include SiN or the like are provided in the order as illustrated.

As shown in the right view of FIG. 1A, the reactive ion etching (RIE) apparatus 8 includes the chamber 9. On the ceiling of the chamber 9, an upper electrode 10 is provided. At the bottom of the chamber 9, a mounting bed 11 for mounting and holding the semiconductor wafer (hereafter "wafer") W is provided. The mounting bed 11 is provided with an electrostatic chuck not shown in the figure. Furthermore, the mounting bed 11 is connected with high-frequency power supplies 17 and 18 which are different in frequency (a high frequency (HF) for source power control and a low frequency (LF) for bias power control). As the reactive ion etching (RIE) apparatus 8 exemplified in FIG. 1, a publicly known parallel plate type reactive ion etching (RIE) apparatus or the like may be used, and details thereof are thus omitted.

First, as shown in the left view of FIG. 1B, gas containing CF gas is introduced to and decomposed and activated by a plasma P to dry-etch the oxide film 3. At that time, the upper resist layer 2 acts as a mask.

When the oxide film 3 is dry-etched, reaction products 12 containing CF gas components are deposited, as shown in the right view of FIG. 1B, in the shape of a mountain on the upper electrode 10 of the reactive ion etching (RIE) apparatus 8.

Next, as shown in the left view of FIG. 1C, before the lower resist layer 4 is dry-etched, the deposition state of reaction products 12 deposited on the upper electrode 10 is adjusted while preventing the lower resist layer 4 from being etched.

The deposition state of the reaction products 12, that is, the amount and distribution state of the deposited reaction products 12, is adjusted by removing part of the reaction products 12 using oxygen ions and oxygen radicals, or hydrogen ions and hydrogen radicals. Finish of this adjustment can be known by an emission monitor and/or time management. Details of adjustment of a deposition state will be described later.

As shown in the right view of FIG. 1C, reaction products 13 left after adjustment of the amount and distribution state of the reaction products 12 are substantially leveled and distributed evenly. In this connection, although all of the reaction products 12 can also be removed, plasma treatment which is enough to remove all of the reaction products 12 is not desirable because it may cause the pattern of the lower resist layer 4 to disappear.

Next, as shown in the left view of FIG. 1(d), gas containing any one of an oxygen gas ($O_2$), a nitrogen gas ($N_2$), a carbon monoxide gas (CO), an ammonia gas ($NH_3$), and a hydrogen gas ($H_2$) is introduced to and decomposed and activated by the plasma P to dry-etch the lower resist layer 4. At that time, the oxide film 3 dry-etched in FIG. 1B acts as a mask (oxide mask).

Since the deposition state of reaction products 13 deposited on the upper electrode has been adjusted prior to this dry-etching, dry-etching which is excellent in the accuracy of line width dimensions and the uniformity in the wafer surface of them can be performed. The upper resist layer 2 is completely removed. Details of being capable of dry-etching which is excellent in the accuracy of line width dimensions and the uniformity in the wafer surface of them will be described later.

Furthermore, as shown in the right view of FIG. 1D, the reaction products 13 are also completely removed by this dry-etching.

Next, as shown in the left view of FIG. 1E, gas containing a CF gas is introduced to and decomposed and activated by the plasma P to dry-etch the oxide film 5. At that time, the lower resist layer 4 acts as a mask. As described above, the lower resist layer 4 is dry-etched with a high dimensional accuracy, so that the oxide film 5 masked by the lower resist layer 4 can also be dry-etched with a high dimensional accuracy.

At that time, as shown in the right view of FIG. 1E, reaction products 14 containing CF gas components are deposited in the shape of a mountain on the upper electrode 10 of the reactive ion etching (RIE) apparatus 8.

Next, as shown in the left view of FIG. 1F, gases containing $O_2$ is introduced to and decomposed and activated by the plasma P to remove (ash) the lower resist layer 4 which is a mask.

At that time, as shown in the right view of FIG. 1F, while removing the reaction products 14 deposited on the upper electrode 10 are also removed, the line width dimensions of the oxide film 5 and the uniformity in the wafer surface of them are adjusted using fluorine (F) radicals generated along with removal of the reaction products 14. Details of adjusting the line width dimensions of the oxide film 5 and the uniformity in the wafer surface of them using F radicals generated will be described later.

Finally, as shown in FIG. 1G, the wafer W is carried out of the chamber 9, and then gas containing $O_2$ is introduced to and decomposed and activated by the plasma P to adjust the deposition state of reaction products 15 which have been left (deposited) on the upper electrode 10.

If the deposition state of the reaction products 15 is adjusted, the accuracy of line width dimensions of the oxide film 5 of the wafer W to be etched next and the uniformity in the wafer surface of the line width dimensions can be increased.

The influence of the reaction products 12 deposited on the upper electrode 10 will be described below.

Figure 2:
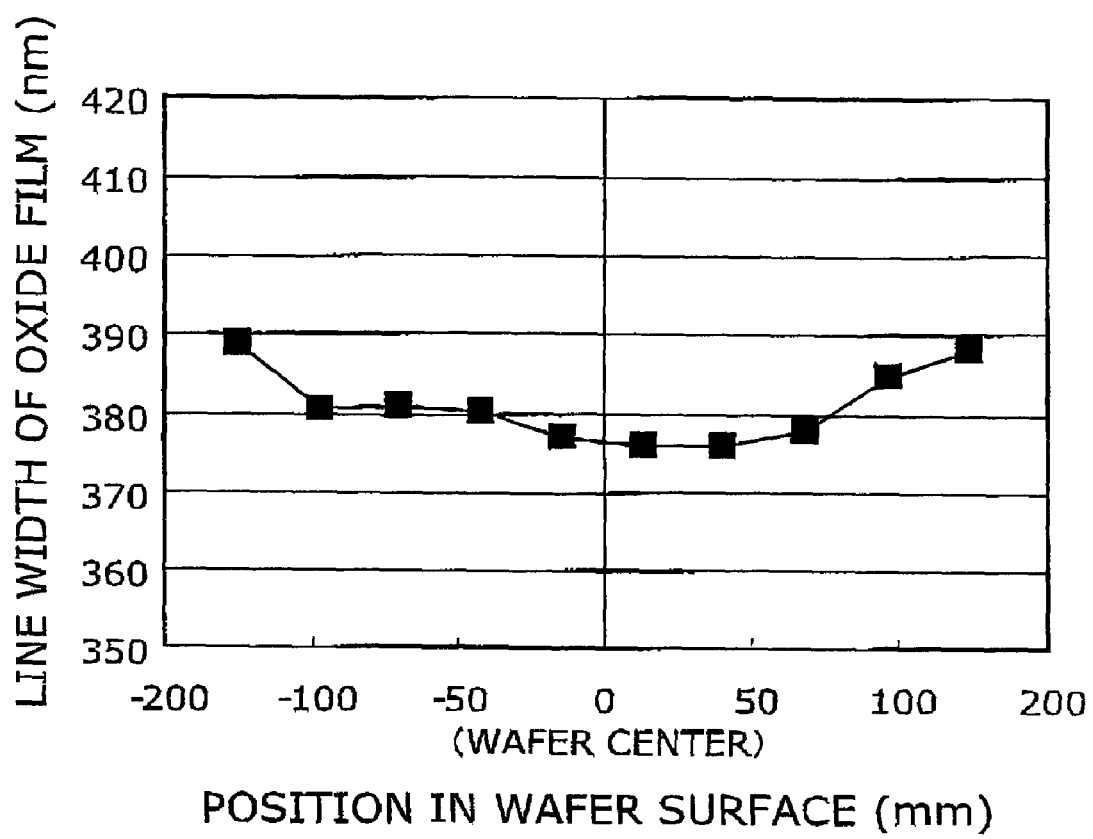
FIG. 2 is a graph illustrating the influence of reaction products deposited in the shape of a mountain on an upper electrode.

FIG. 2 is a graph illustrating the influence of the reaction products 12 deposited in the shape of a mountain on the upper electrode 10. The horizontal axis indicates the position in the wafer surface, and the vertical axis indicates the line width dimension of the oxide film 5.

Figure 3:
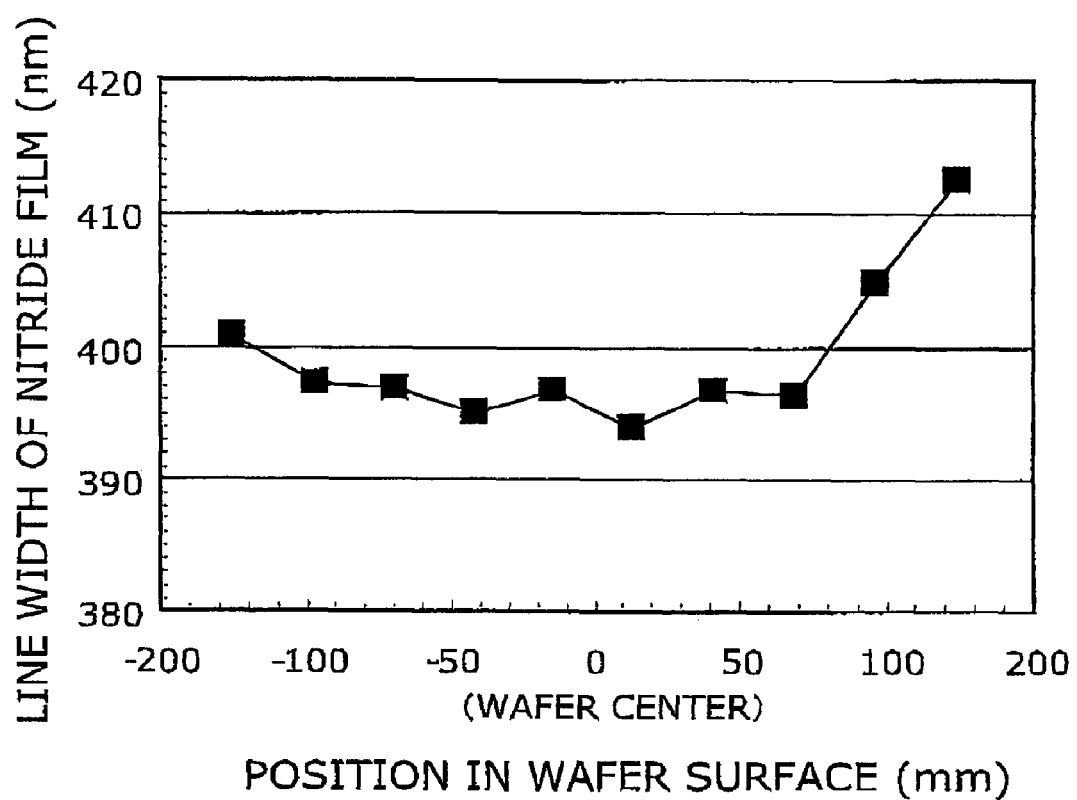
FIG. 3 is a graph showing a distribution in the surface of a wafer of line width dimensions of a nitride film in the case that the nitride film is also dry-etched using an oxide film as a mask.

FIG. 3 is a graph showing a distribution in a wafer surface of line width dimensions of the nitride film 6 when dry-etching also the nitride film 6 using the oxide film 5 as a mask. Dry-etching of the oxide film 5 in FIG. 2 is performed until the oxide film 5 without adjusting the deposition state of the reaction products 12 illustrated in FIG. 1C. Dry-etching of the nitride film 6 in FIG. 3 is performed using the oxide film 5 in FIG. 2 as a mask as it is.

Figure 19:
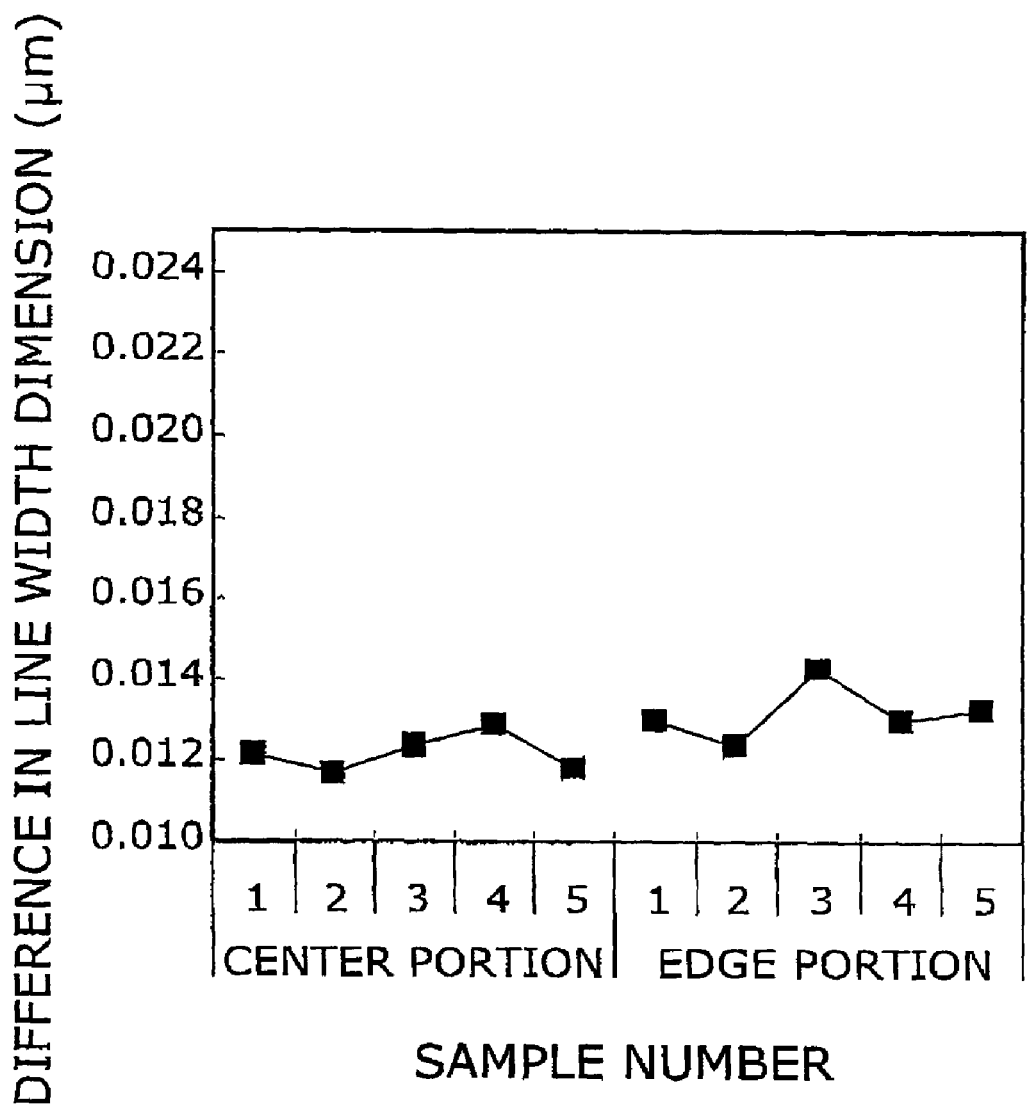
FIG. 19 is a graph illustrating differences between line width dimensions before and after the work of removing (ashing) the lower resist layer.

As understood from FIGS. 2 and 3, there are differences in line width dimension between the center portion and the edge portion of the wafer, which are 16.9 nm in the case of FIG. 2 and 19.9 nm in the case of FIG. 3. In semiconductor devices for which the degree of integration has been increasing in recent years, such large differences in line width dimension are not allowed and become a serious problem.

The inventor has found out causes of such large differences in line width dimension as the result of study.

The first cause is the influence of the reaction products 12 deposited on the upper electrode 10 of the reactive ion etching (RIE) apparatus 8 by dry-etching of the oxide film 3 illustrated in FIG. 1(b). It has bee found out that the reaction products 12 deposited on the upper electrode 10 are decomposed and dissociated during dry-etching of the lower resist layer 4 so that F radicals and ions are generated and the generated F radicals side-etch the oxide film 3 which is a mask. As a result of this, the dimension of the lower resist layer 4 has also become small. It has also been found out that although reaction products are deposited also on the inner wall of the chamber 9, the influence of the reaction products 12 deposited on the upper electrode 10 positioned directly above the wafer W is the most serious.

FIG. 4 is a schematic cross-sectional view illustrating the influence of the reaction products 12 deposited on the upper electrode 10 of the reactive ion etching (RIE) apparatus 8 illustrated in FIG. 1B.

Figure 4A:
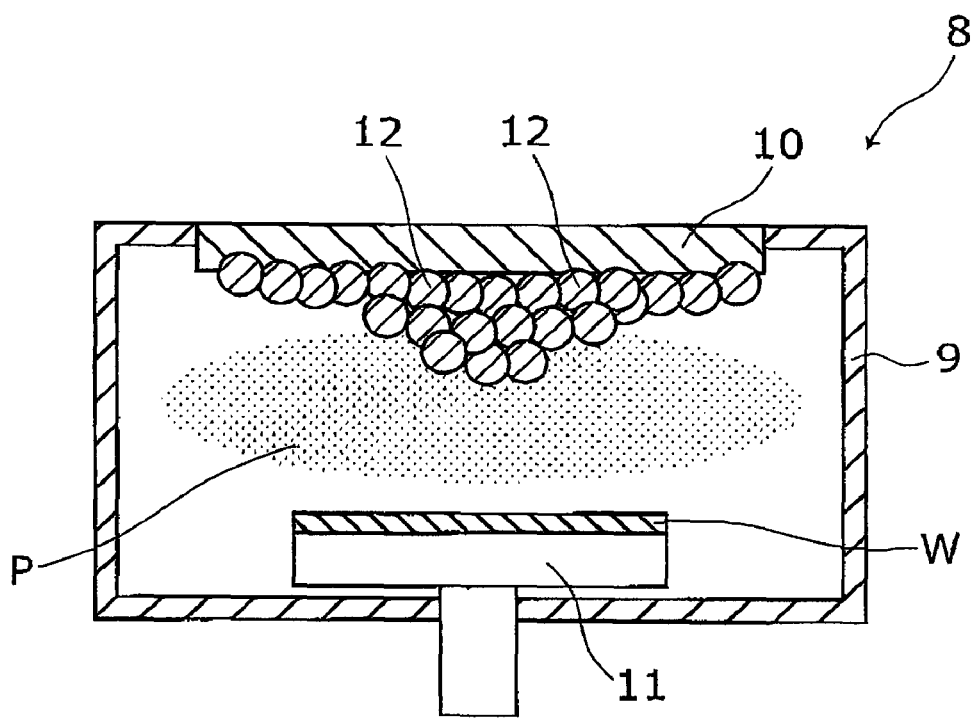
FIG. 4 is a schematic cross-sectional view illustrating the influence of reaction products deposited on the upper electrode of a reactive ion etching (RIE) apparatus.

FIG. 4A is a schematic cross-sectional view showing the state in the chamber 9 after dry-etching of the oxide film 3.

As described above, if the oxide film 3 is dry-etched using the gas containing a CF gas, the reaction products 12 containing fluorine (F) atoms which are components of the CF gas are deposited on the upper electrode 10. At that time, the amount of the deposited reaction products 12 is largest directly above the center portion of the wafer W, and the reaction products 12 are deposited in the shape of a mountain as shown in the figure. This probably occurs because the reaction products 12 are ones dissociated from the CF gas and stuck to the upper electrode, and the plasma density due to the CF gas becomes largest directly above the center portion of the wafer W.

Figure 4B:
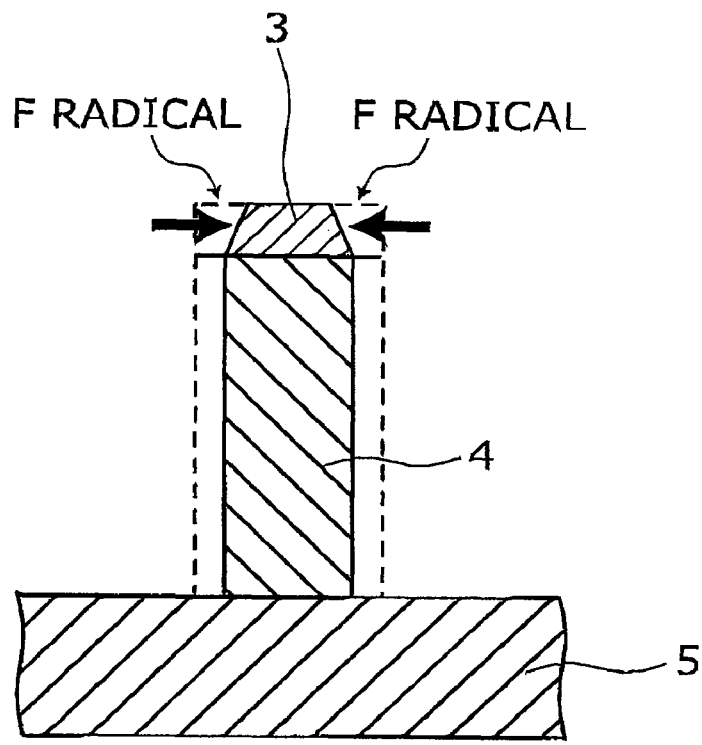

FIG. 4B is a schematic view illustrating that the oxide film 3 as a mask is side-etched during dry-etching of the lower resist layer 4. As described above, for dry-etching of the lower resist layer 4, gas containing any one of an oxygen gas ($O_2$), a nitrogen gas ($N_2$), a carbon monoxide gas (CO), an ammonia gas ($NH_3$), and a hydrogen gas ($H_2$) is used.

Essentially, by any one of these gases, the lower resist layer 4 including an organic material can be dry-etched, but the oxide film 3 including an oxide is not side-etched. However, the reaction products 12 containing fluorine (F) atoms deposited on the upper electrode 10 are decomposed and dissociated during dry-etching of the lower resist layer 4, so that fluorine (F) radicals and ions are generated, and the generated fluorine (F) radicals side-etch the oxide film 3 to reduce line width dimensions of the oxide film 3. Since line width dimensions of the oxide film 3 are reduced, line width dimensions of the lower resist layer 4 under being dry-etched are reduced.

The reduction in line width dimensions of the lower resist layer 4 has a large influence on the accuracy of line width dimensions of the oxide film 5 to be dry-etched next and the uniformity in the wafer surface of the line width dimensions.

Table 1 shows measurement values of components of the reaction products 12 deposited on the upper electrode 10. The measurement was performed by sticking silicon (Si) chips on the center portion and the edge portion (in a position about 10 mm distant from the edge) of the upper electrode 10 and analyzing the composition of reaction products 12 stuck on the silicon (Si) chips by an X-ray photoelectron spectroscopy (XPS) before the dry-etching of the oxide film 3 is completed.

TABLE 1

|  | Center | Edge |  | Center | Edge |
|---|---|---|---|---|---|
| F | 50.2 | 45.7 | F/Si | 50.2 | 45.7 |
| C | 47.3 | 50.0 | C/Si | 47.3 | 50.0 |
| O | 2.6 | 4.3 | O/Si | 2.6 | 4.3 |
| Si | 0.0 | 0.0 |  |  |  |
| F/C | 1.06 | 0.91 | F/C | 1.06 | 0.91 |

As shown in Table 1, it is understood that the reaction products 12 deposited on the upper electrode 10 include carbon (C) atoms, fluorine (F) atoms, and oxygen (O) atoms only, containing fluorine (F) atoms which become a main cause of the aforementioned side-etching. It is also understood that the ratio of fluorine (F) atoms to carbon (C) atoms on the center portion is larger than that on the edge portion. Since fluorine (F) atoms have the effect of accelerating side-etching and carbon (C) atoms have the effect of suppressing side-etching, the larger the ratio of fluorine (F) atoms to carbon (C) atoms, the higher the effect of accelerating side-etching becomes.

In addition, when the thickness of the CF reaction products was measured, it was 66 nm on the center portion and 62 nm on the edge portion, from which it became clear that the reaction products were deposited in the shape of a mountain as described above. This means that the total amount of fluorine (F) atoms becoming a main cause of side-etching on the center portion of the upper electrode 10 is larger than that on the edge portion so that the amount of side-etching of the center portion of the wafer W directly under the upper electrode 10 also becomes larger than that of the edge portion.

This results in that line widths of the center portion of the wafer W are smaller than those of the edge portion of it in FIGS. 2 and 3.

The second cause is the influence of the reaction products 14 deposited on the upper electrode 10 of the reactive ion etching (RIE) apparatus 8 after dry-etching of the oxide film 5 illustrated in FIG. 1E.

FIG. 5 is a schematic view illustrating the influence of the reaction products 14 deposited on the upper electrode 10 of the reactive ion etching (RIE) apparatus 8.

Figure 5A:
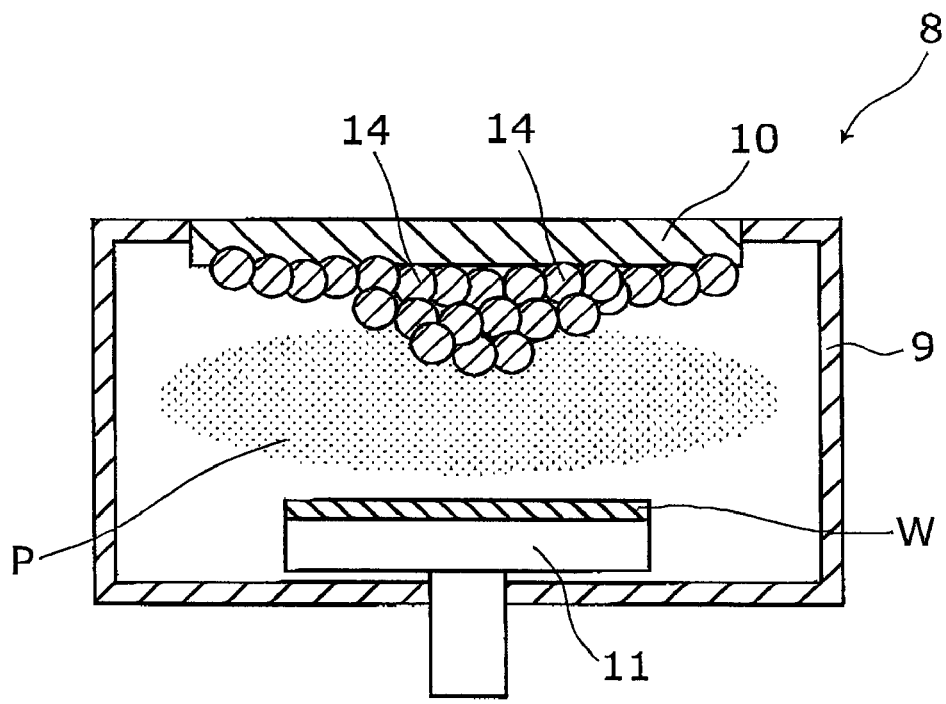
FIG. 5 is a schematic view illustrating the influence of reaction products deposited on the upper electrode of the reactive ion etching (RIE) apparatus.

As shown in FIG. 5(a), also after dry-etching of the oxide film 5, the reaction products 14 containing fluorine (F) atoms are deposited on the upper electrode 10. Also in this case, the reaction products 14 are deposited in such a manner that fluorine (F) atoms on the center portion of the upper electrode 10 are more than those on the edge portion.

Figure 5B:
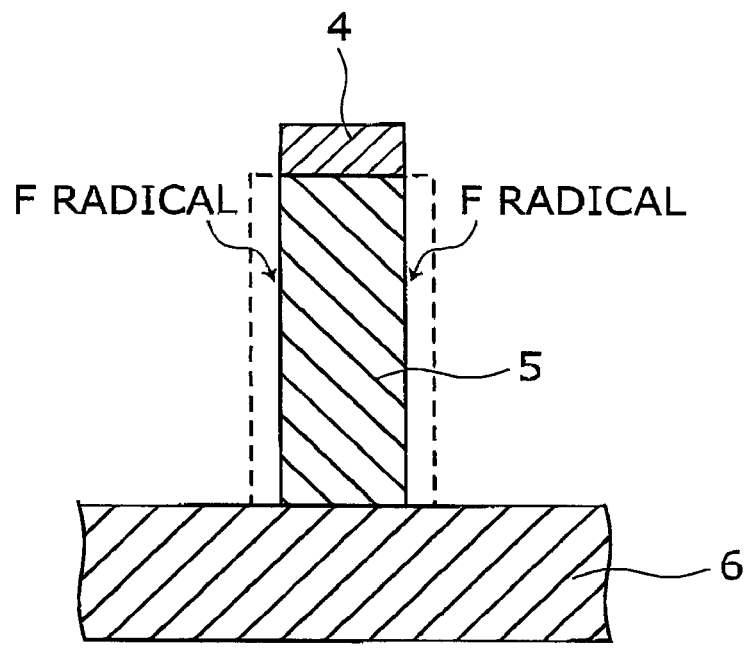

For this reason, if the lower resist layer 4 is removed (ashed) by a normal method which does not use a radio frequency (RF) bias, the oxide film 5 is side-etched, as shown in FIG. 5B, by fluorine (F) radicals generated by decomposition and dissociation of the reaction products 14, which causes deviations of the line width dimensions. In addition, the amount of the side-etching can not be controlled. Also in this case, the amount of fluorine (F) radicals generated on the center portion is larger than that on the edge portion, so that the amount of side-etching of the center portion of the wafer W is larger than that of the edge portion of it.

Furthermore, as illustrated in FIG. 1F, when the lower resist layer 4 is removed (ashed), the reaction products deposited in the chamber 9 are also removed and exhausted. At that time, the reaction products 14 on the edge portion of the upper electrode 10 are removed more easily than those on the center portion, so that the reaction products 14 on the edge portion are reduced earlier than those on the center portion, and the amount of fluorine (F) radicals generated at the edge portion of the wafer thus becomes increasingly smaller. As a result, the difference in the amount of side-etching of the oxide film 5 between the center portion and edge portion of the wafer becomes increasingly larger.

Next, it will be explained that the reaction products 14 on the edge portion of the upper electrode 10 are removed more easily than those on the center portion.

Figure 6:
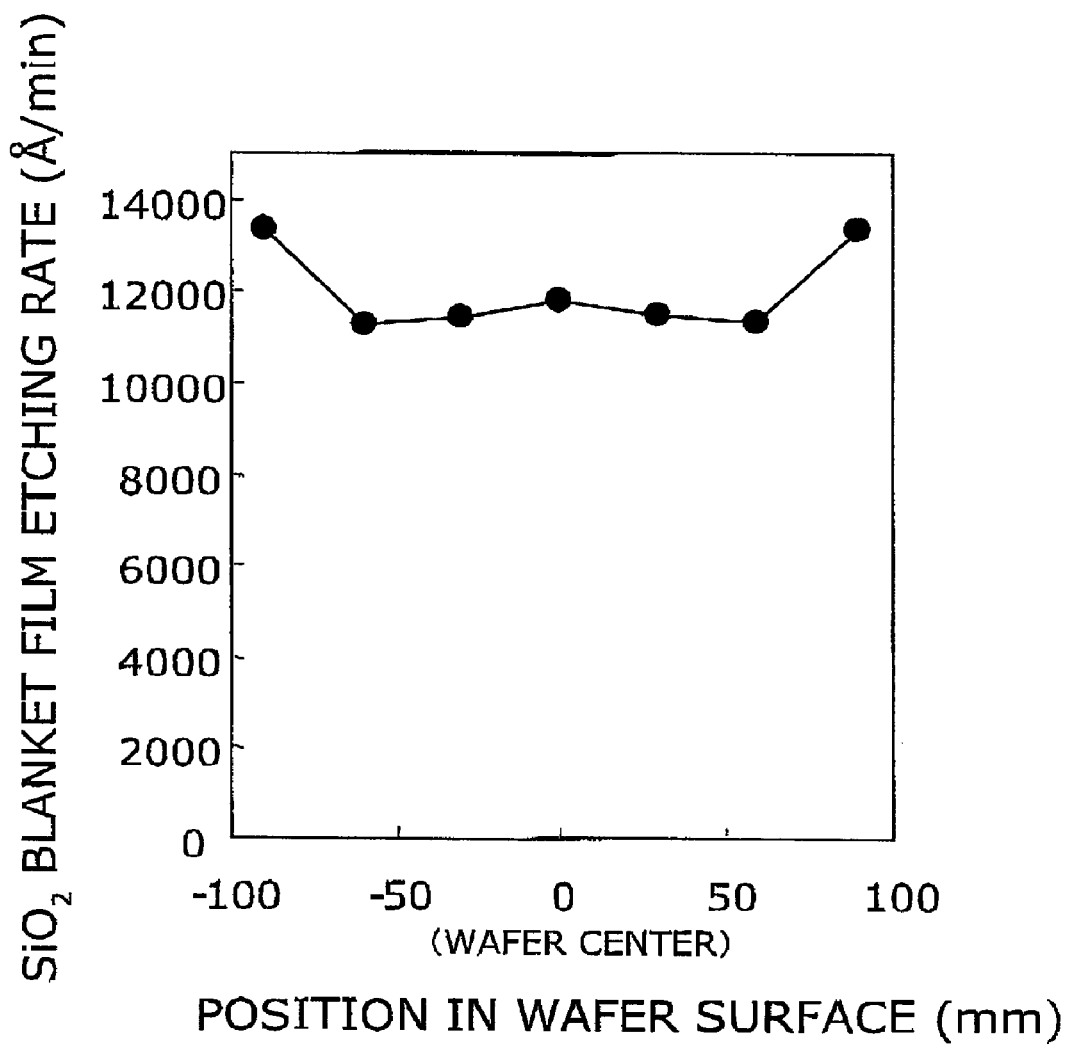
FIG. 6 is a graph illustrating etching rates for a resist film under the condition of removing (ashing) a lower resist layer.

FIG. 6 is a graph illustrating etching rates for a resist film under the condition of removing (ashing) the lower resist layer 4.

Figure 7:
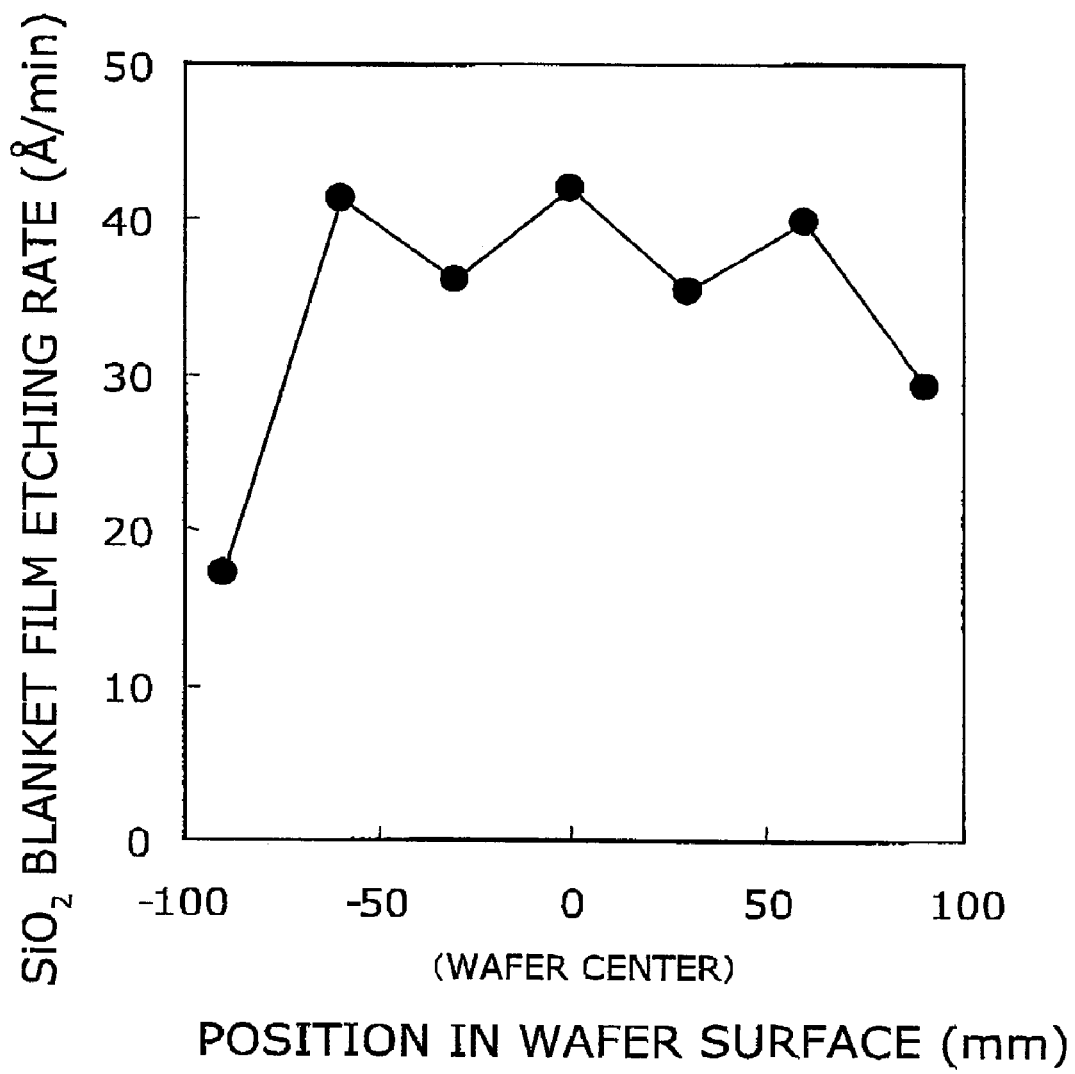
FIG. 7 is a graph illustrating etching rates for a $SiO_2$ film under the condition of removing (ashing) the lower resist layer.

FIG. 7 is a graph illustrating etching rates for a SiO$_2$ film under the condition of removing (ashing) the lower resist layer 4.

The condition of removing (ashing) the lower resist layer 4 in FIGS. 6 and 7 is set to the process pressure of about 8 Pa, the source power of 2400 W (100 MHz), the RF bias power of 0 W (no RF bias is applied), the oxygen gas of 1140 sccm, and the CH$_4$ of 60 sccm. The resist film is attached to the wafer W so as to cover the whole of the surface of it (so-called a resist blanket film), and the SiO$_2$ film is also attached to the wafer W so as to cover the whole of the surface of it (so-called a SiO$_2$ blanket film). Furthermore, the reaction products 12 are deposited on the upper electrode 10.

As shown in FIG. 6, it is understood that etching rates for the resist film of the edge portion of the wafer W are higher than those of the center portion, with easiness of removal accordingly. Since the reaction products 14 deposited on the upper electrode 10 also include organic components like those of the resist film, the reaction products 14 on the edge portion of the upper electrode 10 are also removed more easily than those on center portion.

FIG. 7 shows etching rates when dry-etching a SiO$_2$ film instead of the resist film in FIG. 6. As shown in FIG. 7, it is understood that etching rates for the SiO$_2$ film of the edge portion of the wafer W are lower than those of the center portion, with hardness of dry-etching accordingly. The reason is probably that the reaction products 14 deposited on the edge portion of the upper electrode 10 are easy to be removed and the amount of the reaction products is small, so that the amount of fluorine (F) radicals generated is also small.

Figure 8:
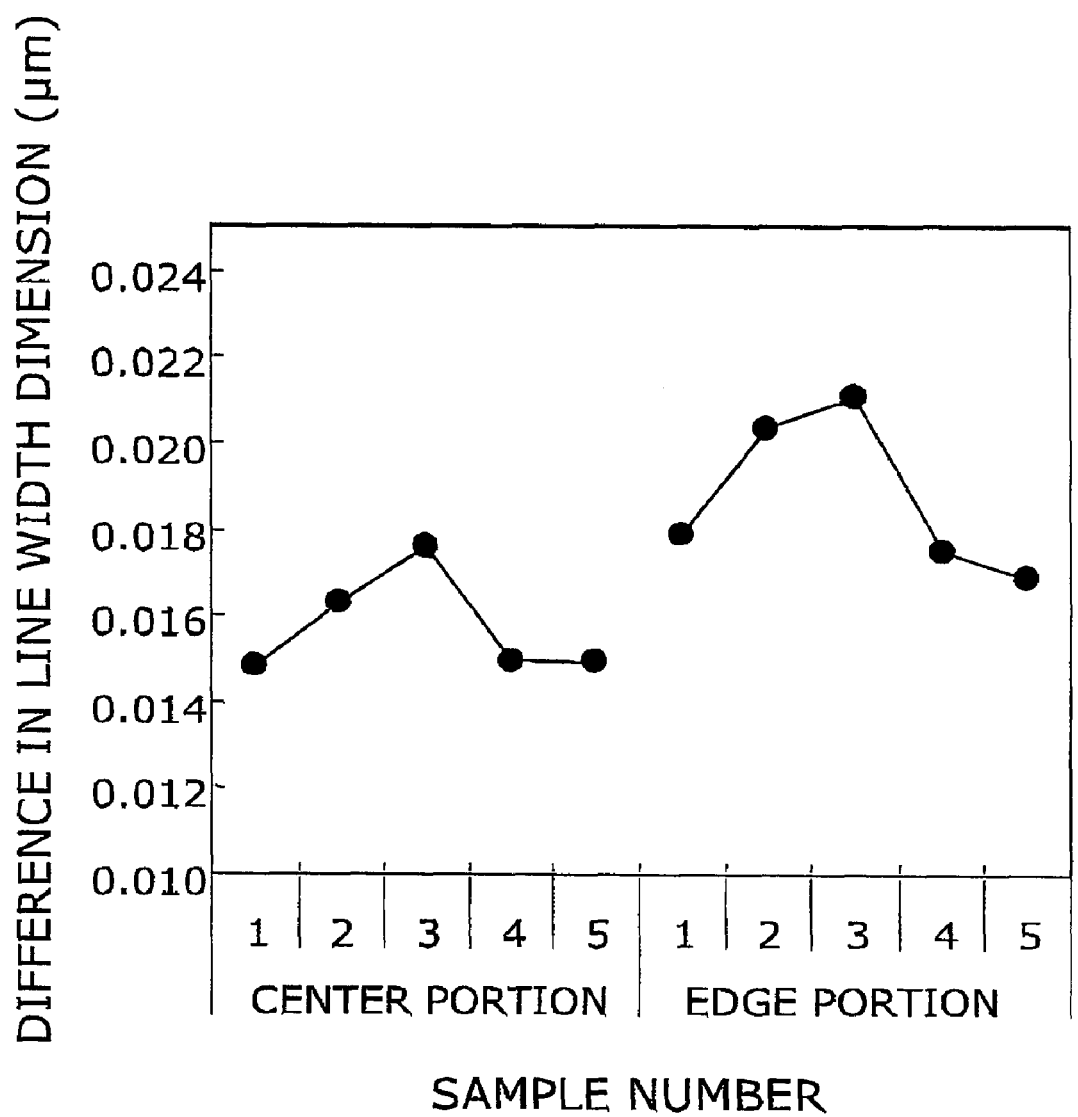
FIG. 8 is a graph illustrating differences between line width dimensions before and after the work of removing (ashing) the lower resist layer.

FIG. 8 is a graph illustrating differences between line width dimensions before and after the work of removing (ashing) the lower resist layer 4. In FIG. 8, the numerical values of the horizontal axis are sample numbers. For example, "1" of the center portion represents the same sample as "1" of the edge portion. As described above, amounts of fluorine (F) radicals generated from the reaction products 14 during removal of the lower resist layer 4 have a distribution. For this reason, the edge portion is difficult to be side-etched more than the center portion, so that line widths of the edge portion are about 3 nm larger than those of the center portion as show in FIG. 8.

The third cause is the influence of reaction products which have been left (deposited) after removal of the lower resist layer 4 illustrated in FIG. 1F.

FIG. 9 is a schematic view illustrating the influence of reaction products 15 which have been left (deposited) after removal of the lower layer 4.

Figure 9A:
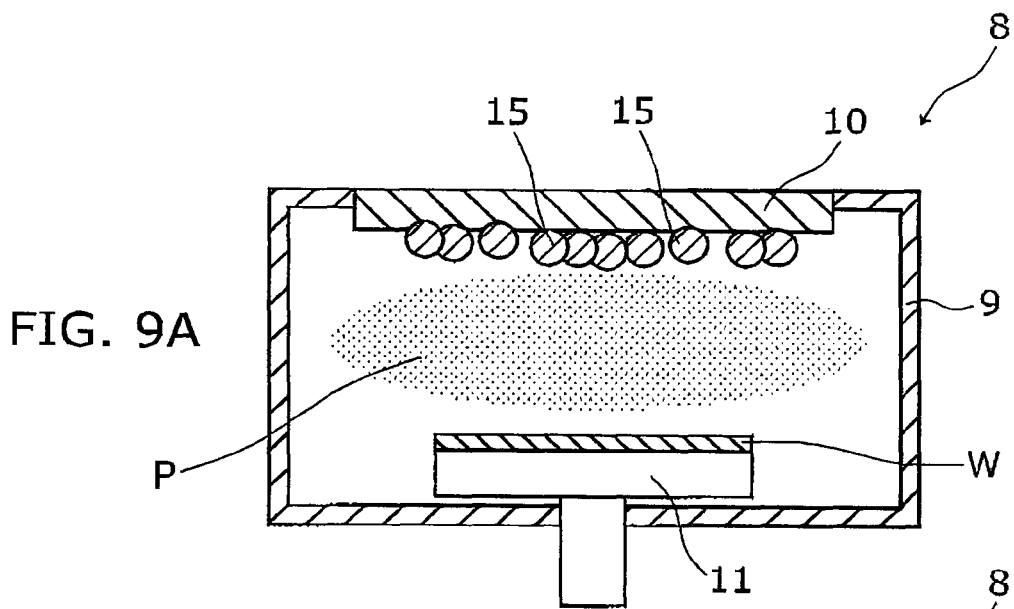
FIG. 9 is a schematic view illustrating the influence of reaction products which have been left (deposited) after removal of the lower resist layer.

As shown in FIG. 9(a), even if, after the oxide film 5 has been dry-etched, the lower resist layer 4 is ashed under the condition that the process pressure is 40 Pa and an RF bias is applied in the same chamber, and at the same time the reaction products 14 deposited in the chamber are intended to be removed, some reaction products 15 are left (deposited).

Table 2 shows measurement values of components of the reaction products 15 left (deposited) on the upper electrode 10. The measurement was performed by sticking silicon (Si) chips on the center portion and the edge portion (in a position about 10 mm distant from the edge) of the upper electrode 10 and analyzing the composition of the reaction products 15 stuck on the silicon (Si) chips by an X-ray photoelectron spectroscopy (XPS) after the lower resist layer 4 has been removed.

TABLE 2

|  | Center | Edge |  | Center | Edge |
|---|---|---|---|---|---|
| F | 12.7 | 6.9 | F/Si | 19.6 | 11.5 |
| C | 10.6 | 6.7 | C/Si | 16.4 | 11.1 |
| O | 41.4 | 46.3 | O/Si | 64.0 | 77.4 |
| Si | 35.4 | 40.1 |  |  |  |
| F/C | 1.19 | 1.03 | F/C | 1.19 | 1.03 |

Figure 9B:
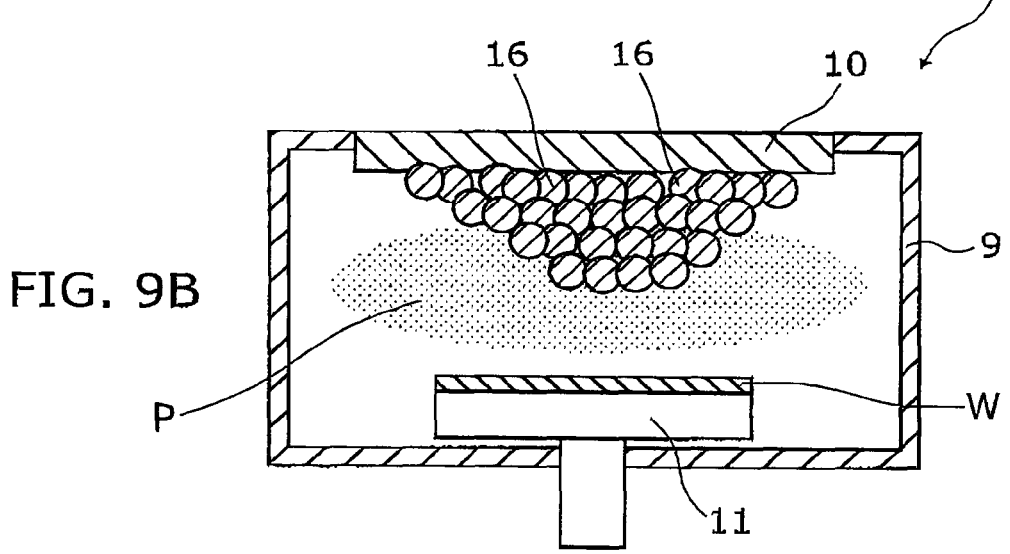

As shown in Table 2, it is understood that more CF reaction products 15 are left (deposited) on the center portion of the upper electrode 10. For this reason, as shown in FIG. 9B, after dry-etching of the oxide film 3 of a wafer to be dry-etched next, the reaction products 16 are further accumulated on the upper electrode 10.

Figure 9C:
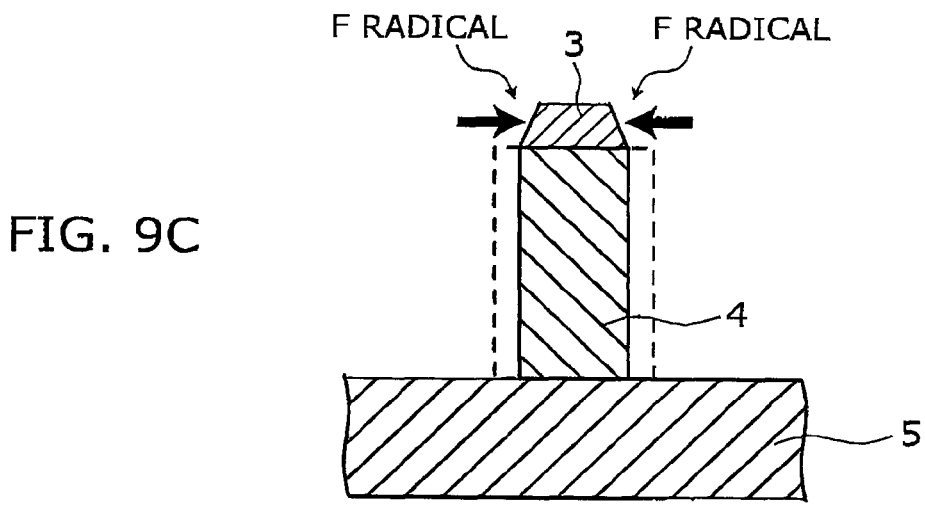

Then, as shown in FIG. 9C, the amount of fluorine (F) radicals generated during dry-etching of the lower resist layer 4 also becomes large and the amount of side-etching of the oxide film 3 also becomes large.

As a result, a difference in line width dimension and a distribution in the wafer surface of line width dimensions which are larger than those of a wafer W dry-etched last time are caused.

Figure 10:
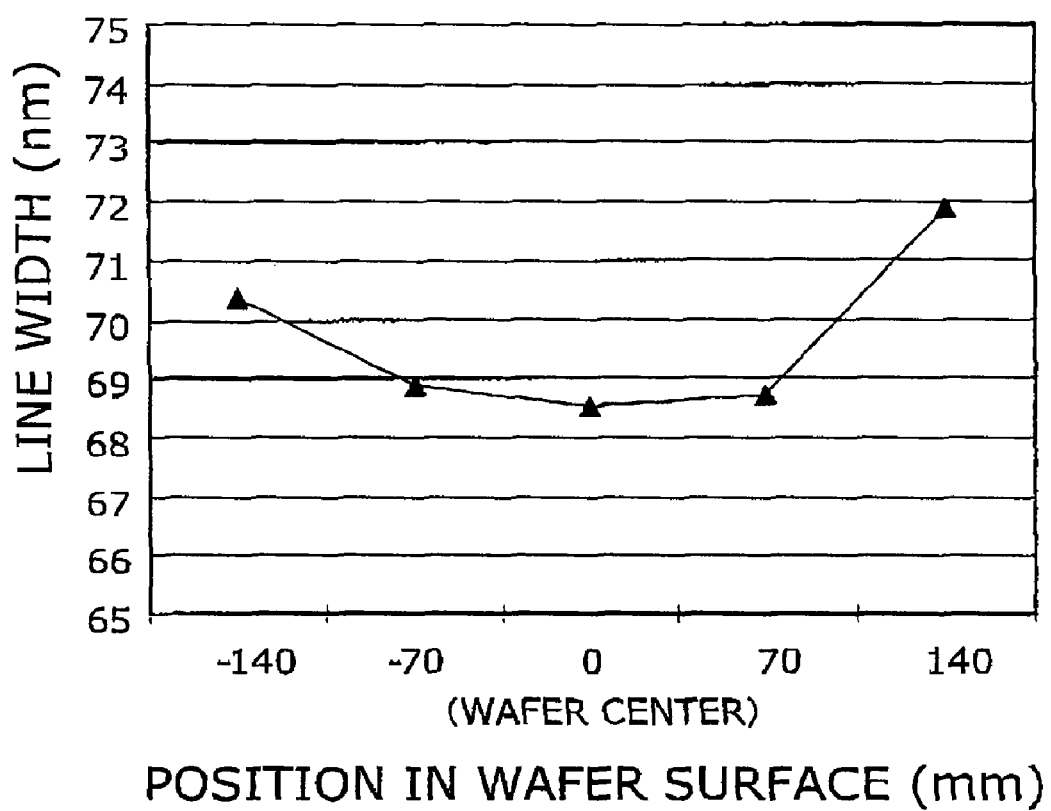
FIG. 10 is a graph showing a distribution of line width dimensions in the surface of a wafer to be dry-etched next when the reaction products have been left (deposited).

FIG. 10 is a graph showing a distribution of line width dimensions in the surface of a wafer to be dry-etched next when the reaction products 15 have been left (deposited). It is understood that as shown in FIG. 10, also when line width dimensions smaller than those in FIG. 2 are made, line width dimensions of the center portion of the wafer W where a larger amount of fluorine (F) radicals is generated are 3 nm or more smaller than those of the edge portion.

As described above, the accuracy of line width dimensions and the uniformity in the wafer surface of them are significantly influenced by a deposition state such as the amount and distribution state of reaction products deposited on the upper electrode 10. In particular, when wafers having a laminated mask 1 are continuously dry-etched in the same chamber, the process becomes complicate, so that there are many opportunities of deposition of reaction products, and therefore the deposition state of reaction products deposited on the upper electrode 10 becomes very important.

In the process shown in FIG. 1, gas containing a CF gas is used for dry-etching of the oxide film 3, so that reaction products containing fluorine (F) atoms are deposited. For this reason, fluorine (F) radicals are generated by decomposition and dissociation of the reaction products and side-etch the oxide film 3. However, in some processes, gas compositions are different and reaction products containing more carbon atoms can be deposited. In that case, removal of the oxide film comes to be suppressed by decomposition and dissociation of the reaction products. In other words, considering that side-etching is suppressed by some compositions of the reaction products, it is necessary to increase the accuracy of the line width dimensions and the uniformity of the wafer surface of them.

The inside of the chamber 9 is probably cleaned after each dry-etching in order to completely eliminate the influence of reaction products deposited on the upper products 10. However, in general, the inside of the chamber 9 can be cleaned only when there is no wafer W, and a cleaning process is thus required separately, so that the manufacturing efficiency is reduced significantly. Furthermore, if the number of times of cleanings is limited in order to suppress the reduction of the manufacturing efficiency, amounts of reaction products deposited on the upper electrode 10 are different between just before and just after cleaning, which causes a problem that qualities vary in a manufacturing lot.

The influence of reaction products 12 deposited on the upper electrode 10 after dry-etching of the oxide film 3, which is described as the first cause, is eliminated as described below.

The inventor has found out, as the result of study, that if a deposition state such as the amount and distribution state of reaction products deposited on the upper electrode 10 is adjusted, the accuracy of line width dimensions and the uniformity in the wafer surface of them can be increased, and dry-etching can be performed continuously in the same chamber.

FIG. 11 is a schematic cross-sectional view illustrating elimination of the influence of reaction products 12 deposited on the upper electrode 10 after dry-etching of the oxide film 3.

As shown in FIG. 11A, after dry-etching of the oxide film 3, the reaction products 12 containing CF gas components are deposited in the shape of a mountain on the upper electrode 10. This is schematically illustrated in FIG. 1B.

Next, as shown in FIG. 11B, before dry-etching of the lower resist layer 4, the deposition state of the reaction products 12 deposited on the upper electrode 10 is adjusted while preventing the lower resist layer 4 from being etched. This is schematically illustrated in FIG. 1(c). Reaction products 13 left after adjustment of the amount and distribution state of the reaction products 12 are substantially leveled and distributed evenly.

Table 3 shows measurement values of components of reaction products 12 after the deposition state of reaction products 12 deposited on the upper electrode 10 has been adjusted while preventing the lower resist layer 4 from being etched before dry-etching of the lower resist layer 4. Processing time for this adjustment is 15 seconds. The measurement was performed by sticking silicon (Si) chips on the center portion and the edge portion (in a position about 10 mm distant from the edge) of the upper electrode 10 and analyzing the composition of reaction products 12 left on the silicon (Si) chips by an X-ray photoelectron spectroscopy (XPS) after the deposition state of reaction products 12 deposited on the upper electrode 10 had been adjusted for 15 seconds while preventing the lower resist layer 4 from being etched after dry-etching of the oxide film 3.

TABLE 3

|  | Center | Edge |  | Center | Edge |
|---|---|---|---|---|---|
| F | 4.1 | 5.5 | F/Si | 6.6 | 8.3 |
| C | 15.8 | 21.0 | C/Si | 25.5 | 31.6 |
| O | 41.9 | 40.0 | O/Si | 67.9 | 60.1 |
| Si | 38.3 | 33.5 |  |  |  |
| F/C | 0.26 | 0.26 | F/C | 0.26 | 0.26 |

As shown in Table 3, it is understood that the reaction products 12 left on the upper electrode 10 include carbon (C) atoms, fluorine (F) atoms, and oxygen (O) atoms only, and the F/C ratios of fluorine (F) atoms which becomes a main cause of the aforementioned side-etching to carbon (C) atoms are reduced by 70 to 80% as compared with the values in Table 1 just after etching of the oxide film 3. Furthermore, it is also understood that there is no difference in value between the edge portion and the center portion.

Concrete examples of adjustment of the deposition state are described below. First, the deposition state of reaction products 12 deposited on the upper electrode 10 can be adjusted while preventing the lower resist layer 4 from being etched by allowing CF reaction products 12 to react with oxygen ions and radicals, or hydrogen ions and radicals to remove the fluorocarbon components.

Secondly, the deposition state of reaction products 12 deposited on the upper electrode 10 can be adjusted while preventing the lower resist layer 4 from being etched by introducing an oxygen gas and allowing the oxygen gas to react with carbon atoms in the reaction products 12 or to react with carbon atoms and fluorine (F) atoms in the reaction products 12, in order to remove the fluorocarbon components. When only an oxygen gas is introduced, the plasma may become unstable and the distribution in the wafer surface of line width dimensions of the lower resist layer 4 may deteriorates. However, if a condition of stabilizing the plasma (for example, a low pressure condition, a high source power condition, or the like) is selected, good processing can be done by reducing the processing time, etc. also in the case that only an oxygen gas is introduced.

Thirdly, it is more desirable to further prevent the lower resist layer 4 from being etched by adding a CH gas or a CO gas to the aforementioned oxygen gas.

Fourthly, it is more desirable to increase the thickness of the plasma sheath to further prevent the lower resist layer 4 from being etched by reducing the plasma source power to 500 W or less to lower the electron density (Ne), or by increasing the pressure to 13 Pa or more to raise the self-bias voltage (Vdc).

In addition, examples of concrete conditions are described below. In the third case described above, the source power may be set to 400 to 1000 W, the pressure may be set to 66 to 107 Pa, the processing time may set to about 10 to 20 seconds, and a $CH_4$ gas of about 1 to 8.5 wt % (20 to 150 sccm) may be added to an oxygen gas (1650 to 1780 sccm).

After the adjustment of the deposition state of the reaction products 12 illustrated in FIG. 11(*b*), the lower resist layer 4 is dry-etched.

FIG. 11C is a schematic view illustrating that the oxide film 3 as a mask is not side-etched during dry-etching of the lower resist layer 4.

As described above, for dry-etching of the lower resist layer 4, gas containing any one of an oxygen gas (O2), a nitrogen gas (N2), a carbon monoxide gas (CO), an ammonia gas (NH3), and a hydrogen gas (H2) is used. For this reason, by any one of these gases, the lower resist layer 4 including an organic material can be dry-etched, but the oxide film 3 including an oxide is not side-etched. Furthermore, since the deposition state of reaction products 12 containing fluorine (F) atoms deposited on the upper electrode 10 has been adjusted, fluorine (F) radicals and ions generated are very few. For this reason, the oxide film 3 is not side-etched by fluorine (F) radicals, and the lower resist layer 4 can be thus dry-etched with a high accuracy. As a result, the accuracy of line width dimensions of the oxide film 5 to be dry-etched next can also be increased.

Next, an effect of adjusting the deposition state of the reaction products 12 will be described.

Figure 12:
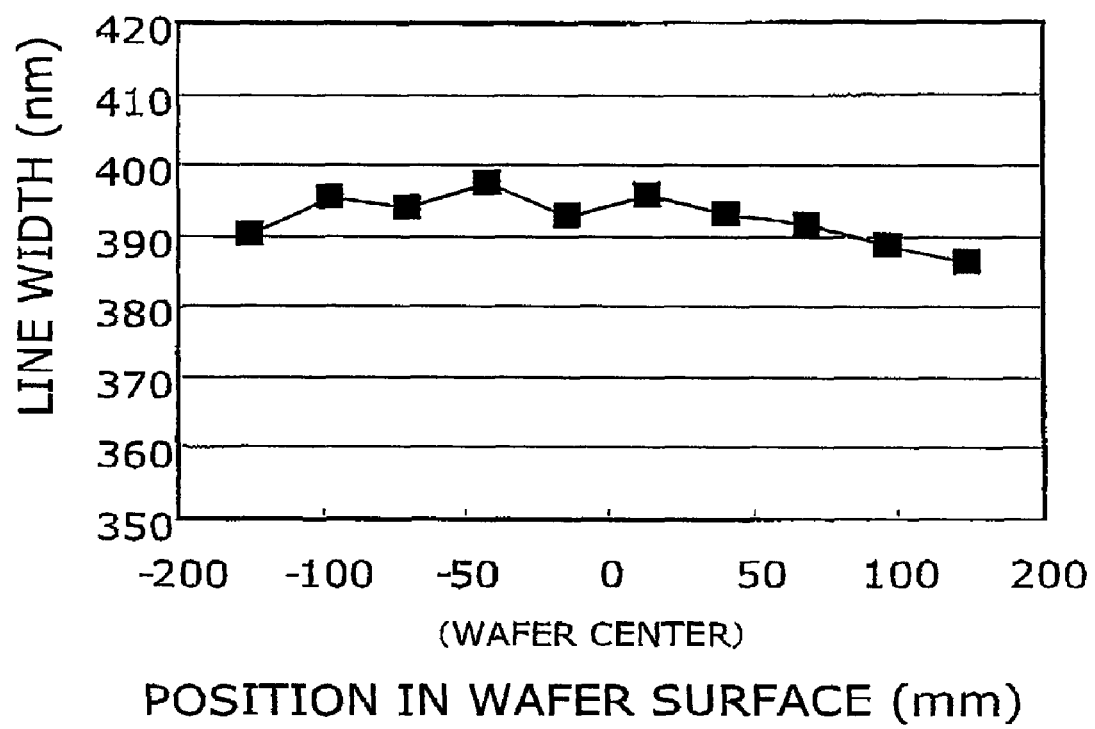
FIG. 12 is a graph illustrating an effect of adjusting the deposition state of reaction products.

FIG. 12 is a graph illustrating an effect of adjusting the deposition state of the reaction products 12. The horizontal axis indicates the position in the wafer surface, and the vertical axis indicates the line width dimension of the oxide film 5.

Figure 13:
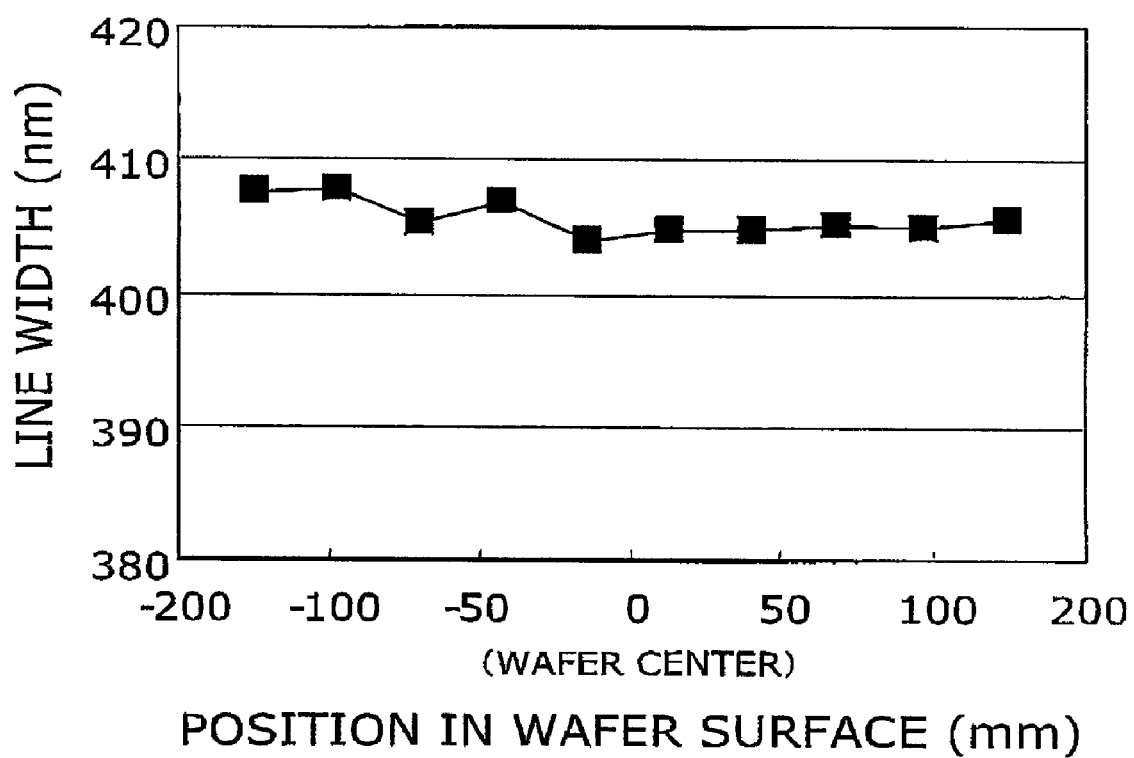
FIG. 13 is a graph showing a distribution in the surface of a wafer of line width dimensions of a nitride film when dry-etching also the nitride film using the oxide film as a mask.

FIG. 13 is a graph showing a distribution in the wafer surface of line width dimensions of the nitride film 6 in the case that the nitride film 6 is also dry-etched using the oxide film 5 as a mask. The dry-etching of the oxide film 5 in FIG. 12 was performed subsequently to the aforementioned dry-etching of the lower resist layer 4. Furthermore, the dry-etching of the nitride film 6 in FIG. 13 was performed using the oxide film 5 in FIG. 12 as a mask as it is.

As understood from FIG. 12, the difference in line width dimension between the center portion and the edge portion of the wafer W was 12.6 nm. Furthermore, as understood from FIG. 13, the difference in line width dimension between the center portion and the edge portion was 6.7 nm.

When these values (12.6 nm and 6.7 nm) are compared with those in FIG. 2 (16.9 nm) and FIG. 3 (16.9 nm), respectively, for which the deposition state of the reaction products 12 has not been adjusted, it is understood that profiles in the wafer surface are each changed from a concave to a convex to significantly improve the tendency for the center parts of them to be narrow.

Figure 14:
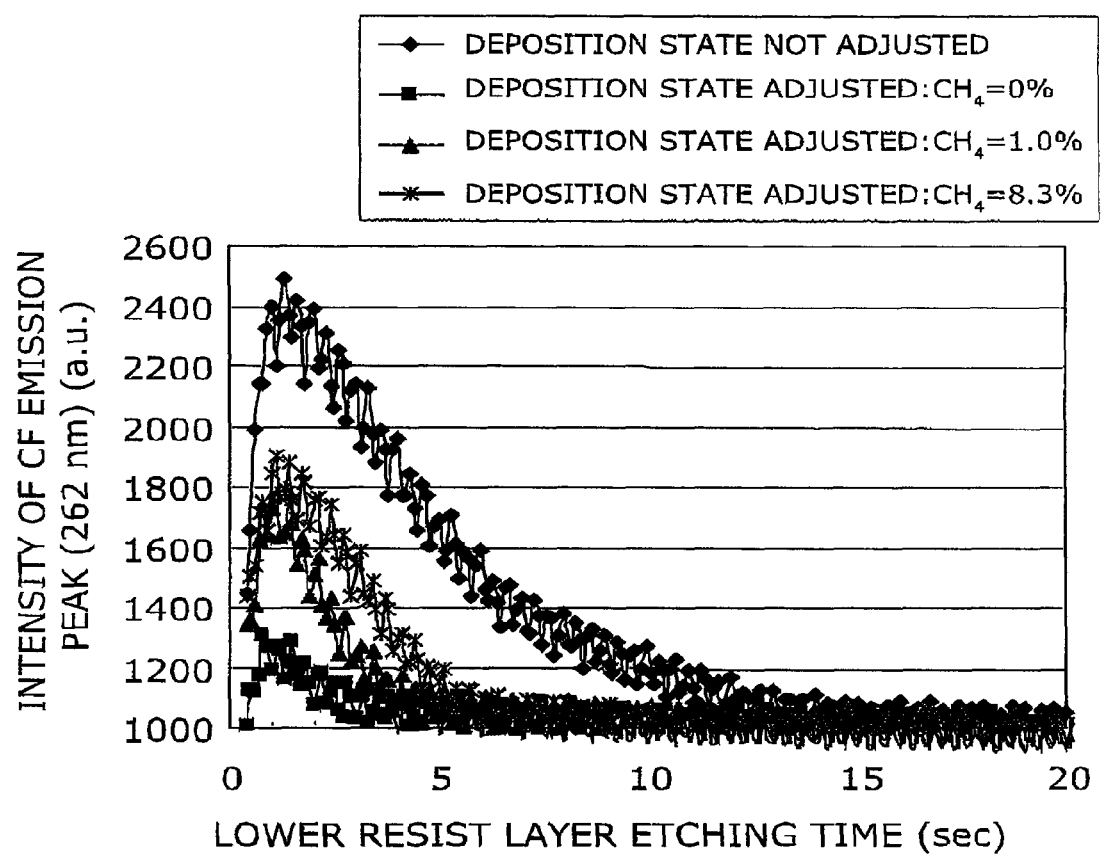
FIG. 14 is a graph illustrating an effect of suppressing generation of fluorine F radicals by adjusting a deposition state.

FIG. 14 is a graph illustrating an effect of suppressing the generation of fluorine (F) radicals by adjusting a deposition state. The horizontal axis indicates the time for dry-etching the lower resist layer 4, and the vertical axis indicates the intensity of a CF emission peak (wavelength: 262 nm).

As understood from FIG. 14, the intensity of the CF emission peak in the case that the deposition state has been adjusted is lower than that in the case that the deposition state has not been adjusted. This means that the generation of light radicals is suppressed. Furthermore, it is also understood that the smaller the amount of the aforementioned $CH_4$ gas added to the oxygen gas when the deposition state is adjusted, the more the intensity of the CF emission peak (wavelength: 262 nm) is reduced (the more the generation of fluorine (F) radicals is suppressed).

Figure 15:
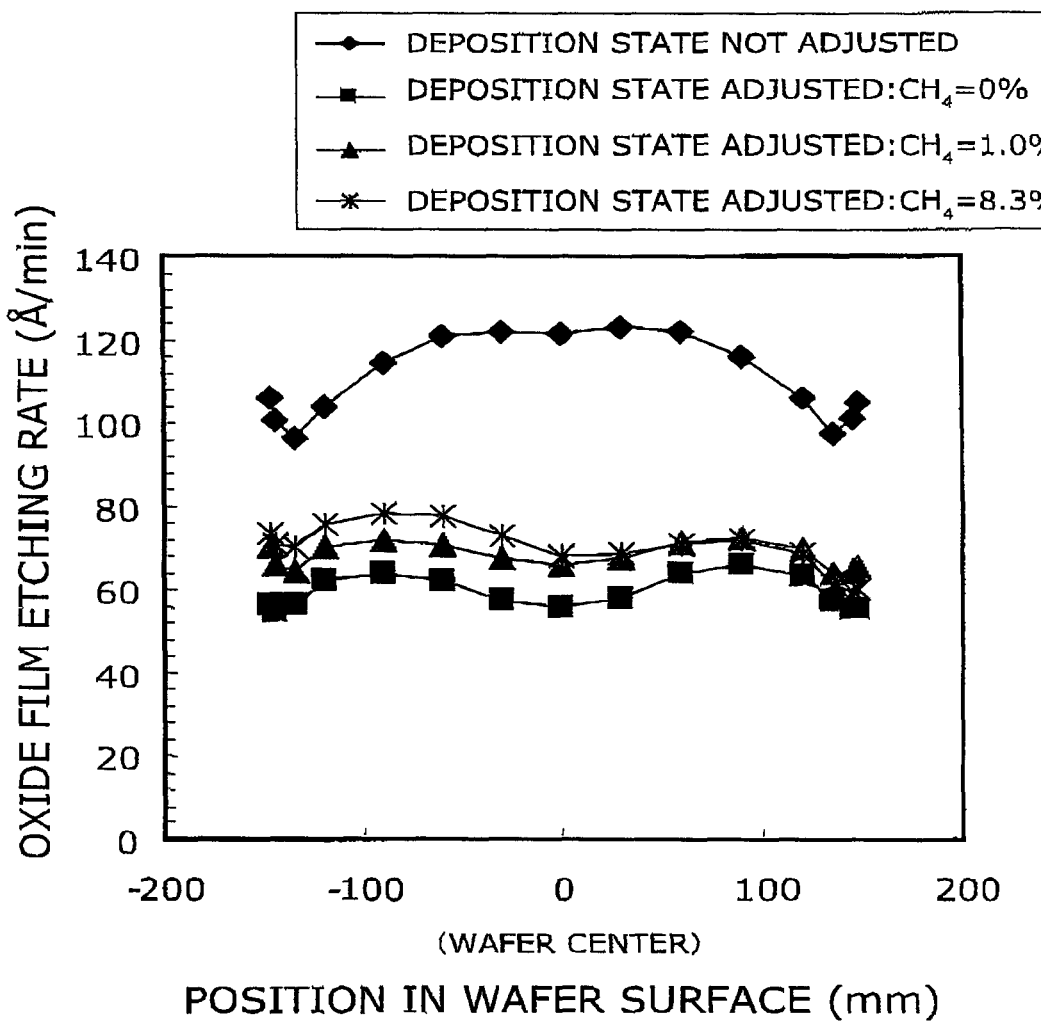
FIG. 15 is a graph illustrating an effect of preventing the oxide film from being side-etched by adjusting the deposition state.

FIG. 15 is a graph illustrating an effect of preventing the oxide film 3 from being side-etched by adjusting the deposition state. The horizontal axis indicates the position in the wafer surface, and the vertical axis indicates the etching rate for the oxide film 3. Conditions of dry-etching were set to be identical to those in the case that the lower resist layer 4 was dry-etched, and the distribution in the wafer surface of etching rates for the oxide film 3 as a mask at that time was evaluated.

As understood from FIG. 15, etching rates in the case that the deposition state has been adjusted are reduced to about half of those in the case that the deposition state has not been adjusted. Furthermore, it is understood that the smaller the amount of the aforementioned $CH_4$ gas added to the oxygen gas when the deposition state is adjusted, the more the etching rate for the oxide film 3 can be reduced. This means that the oxide film 3 is more difficult to be side-etched in the case that the deposition state has been adjusted.

Figure 16:
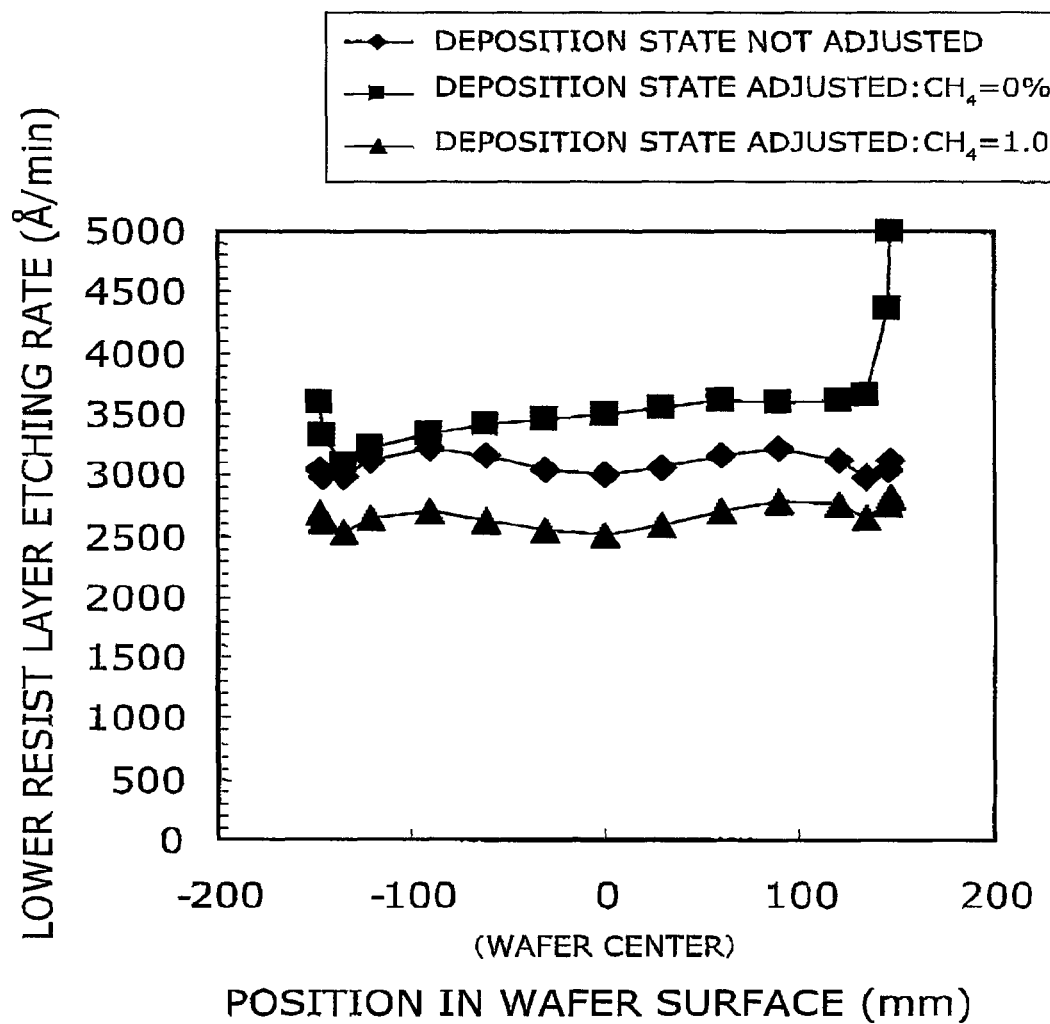
FIG. 16 is a graph illustrating an etching characteristic of a lower resist layer when adjusting the deposition state.

FIG. 16 is a graph illustrating the etching characteristic of the lower resist layer 4 when the deposition state has been adjusted. The horizontal axis indicates the position in the wafer surface, and the vertical axis indicates the etching rate for the lower resist layer 4.

As understood from FIG. 16, when the deposition state has been adjusted without addition of a $CH_4$ (with an oxygen gas only), the etching rate for the lower resist layer 4 suddenly increases at the wafer edge portion, and the distribution in the wafer surface of etching rates becomes bilaterally unsymmetrical. For this reason, the uniformity in the wafer surface of the line width dimensions can be deteriorated, so that it is inadequate to adjust the deposition state with an oxygen gas only.

The inventor has found out, as the result of study, that it is desirable that the amount of a $CH_4$ gas added be 1 wt % or more and less than 8.3 wt %, because if the amount of a $CH_4$ gas added is less than 1 wt %, a problem arises in the aforementioned etching characteristic of the lower resist layer 4, and if the amount of a $CH_4$ gas added is 8.3% or more, it takes much time to adjust the deposition state of the reaction products 12, and the manufacturing efficiency is thus reduced.

Next, it will be described to conversely use the reaction products 14, which is described as the second cause, deposited on the upper electrode 10 after dry-etching of the oxide film 5.

The inventor has found out, as the result of study, that if, while removing the reaction products 14 deposited on the upper electrode, fluorine (F) radicals generated along with removal of the reaction products 14 are used, the accuracy of line width dimensions of the oxide film 5 and the uniformity in the wafer surface of them can be adjusted.

Even if the aforementioned adjustment of the amount of the deposited reaction products 14 has been performed, there may be a little variation in uniformity in the wafer surface of the line width dimensions. For example, as understood from FIG. 12, the difference in line width dimension between the center portion and the edge portion of the wafer W is about 12.6 nm. It can be said that such a difference in line width dimension is allowed, but there is a case that further improvement is desired in semiconductor devices for which the degree of integration has been increasing in recent years.

In this case, although a side-etching process for improving the uniformity in the wafer surface of line width dimensions may be provided, but doing so increases the number of processes and causes new problems in terms of the manufacturing efficiency and the cost. For this reason, it is beneficial that when performing ashing which is the final step of etching, for example, in the case of FIG. 12, line widths of the center portion of the wafer are made slightly narrow by side-etching along with removal of the mask to improve the uniformity in the wafer surface of the line width dimensions.

However, if ashing is performed under the condition that a normal bias is not applied, fluorine (F) radicals generated by decomposition of the reaction products 14 are removed in the early stage of the ashing, so that side-etching of the oxide film 5 does not proceed, and the uniformity in the wafer surface of the line width dimensions can not be thus improved.

The inventor has found out, as the result of study, a way of improving line width dimensions and the uniformity in the wafer surface of them along with removal of a mask when performing ashing which is the final stage of dry-etching.

First, it is desirable that a gas to be used be an oxygen gas, because, when an oxygen is used, the lower resist layer 4 as a mask can be removed (ashed) and the fluorocarbon components of the reaction products 14 can be removed and exhausted as CO or COF, and it becomes possible to perform side-etching of the oxide film 5 using fluorine (F) radicals generated at that time.

Furthermore it is more desirable to add a CH gas to the oxygen gas, because fluorocarbon components of the reaction products 14 can be effectively removed by changing (H+F) to HF.

Next, it is more desirable to control the amount of side-etching of the oxide film 5 by applying the RF bias and controlling the amount of it.

The RF bias is not applied in normal ashing, but is useful for controlling the amount of side-etching of the oxide film 5.

Next, an effect of applying an RF bias will be described.

Figure 17:
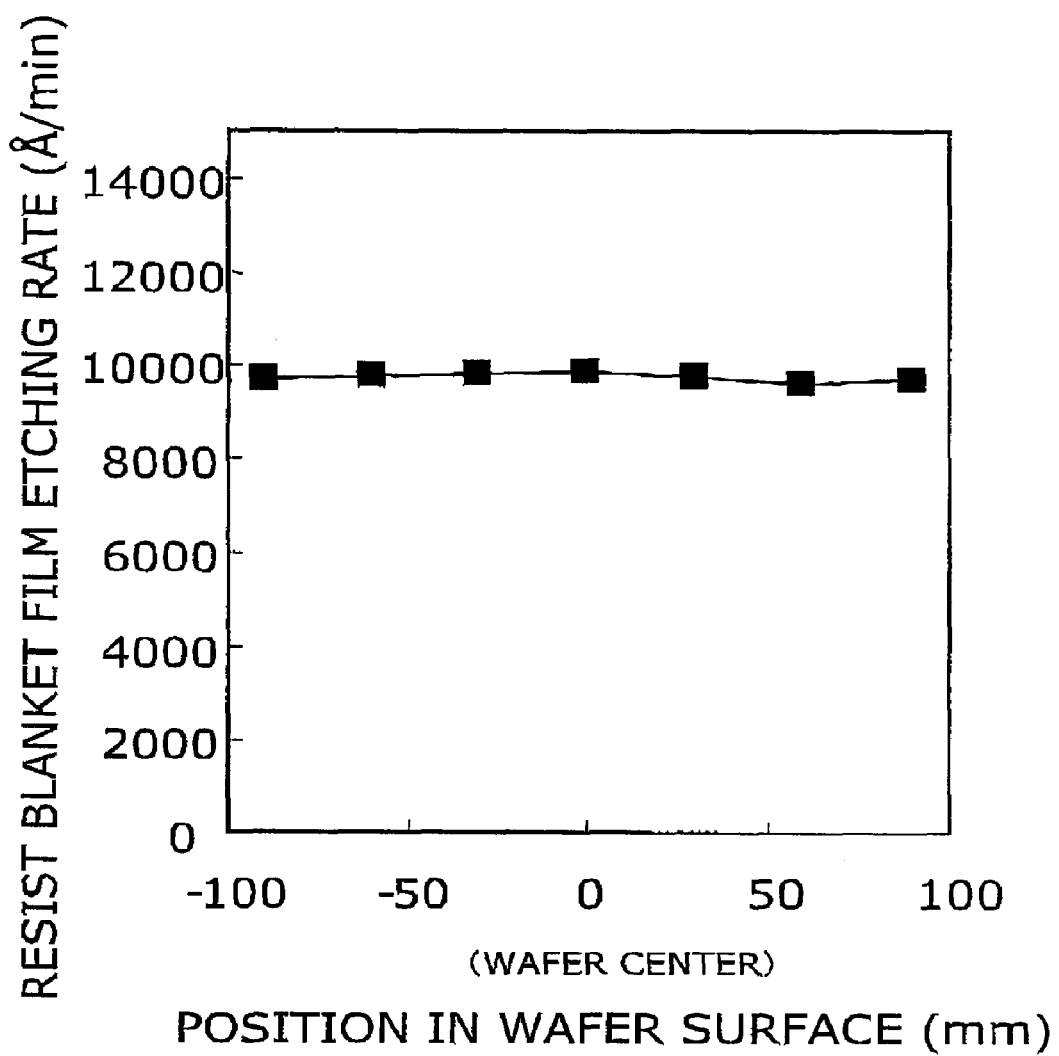
FIG. 17 is a graph illustrating etching rates for a resist film layer under the condition of ashing the lower resist layer.

FIG. 17 is a graph illustrating etching rates for the resist film under the condition of ashing the lower resist layer 4.

Figure 18:
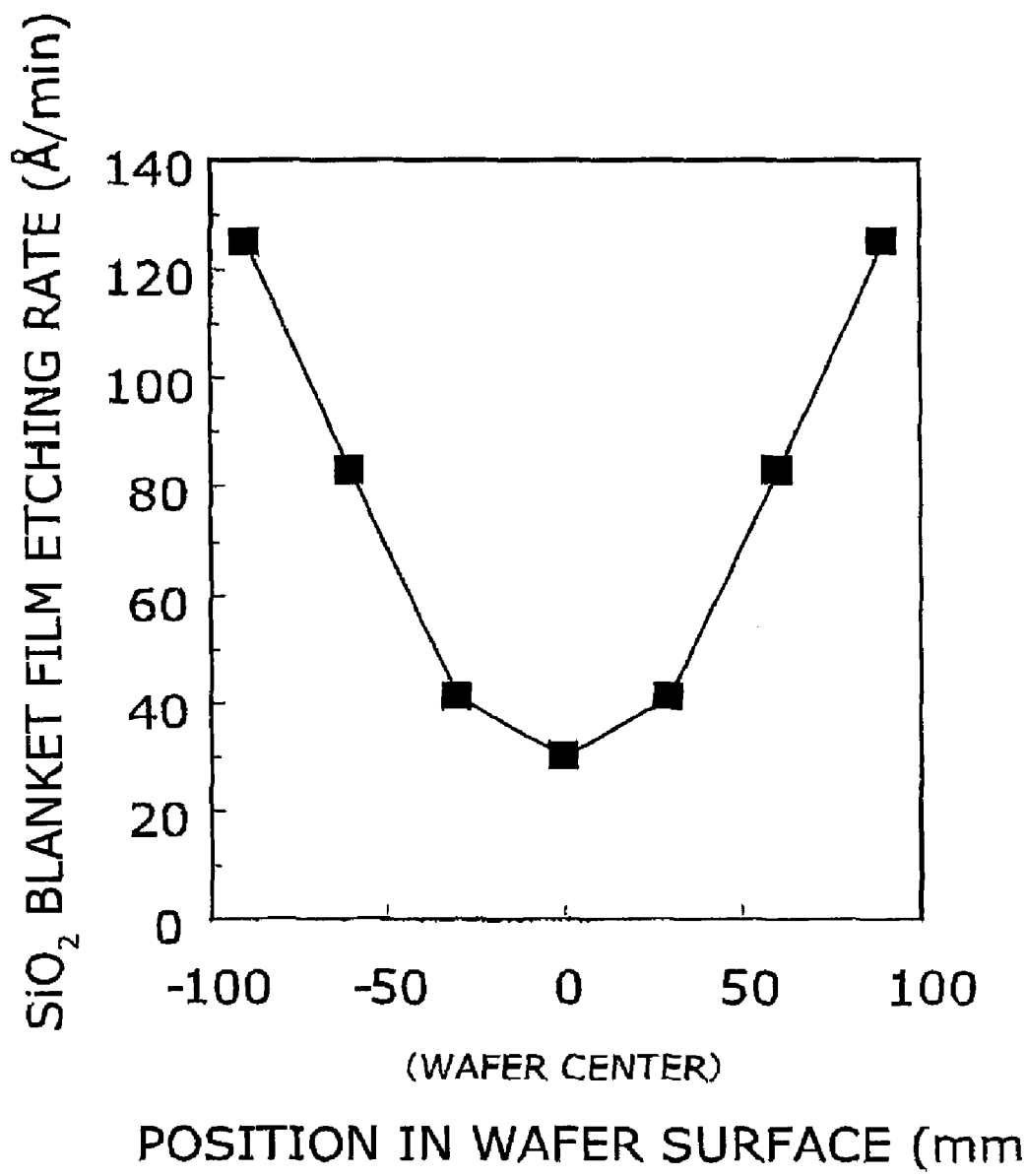
FIG. 18 is a graph illustrating etching rates for a $SiO_2$ film under the condition of ashing the lower resist layer.

FIG. 18 is a graph illustrating etching rates for the $SiO_2$ film under the condition of ashing the lower resist layer 4.

The ashing condition in FIGS. 17 and 18 is set to the process pressure of about 40 Pa, the source power of 500 W (100 MHz), the RF bias power of 300 W (3.2 MHz), and the oxygen gas of about 400 sccm. The resist film is attached to the wafer W so as to cover the whole of the surface of it (so-called a resist blanket film), and the $SiO_2$ film is also attached to the wafer W so as to cover the whole of the surface of it (so-called a $SiO_2$ blanket film). Furthermore, the reaction products 14 have been deposited on the upper electrode 10.

As shown in FIG. 17, it is understood that when an RF bias is applied, ashing of the resist film is performed almost evenly in the wafer surface. On the other hand, as shown in FIG. 18, it is understood that when an RF bias is applied, the etching rate for the $SiO_2$ film is extremely high at the edge portion of the wafer.

As compared with this, although the condition of the gas, etc. are different, when the RF bias is not applied as shown in FIG. 7, the etching rate for the $SiO_2$ film is reduced conversely at the edge portion of the wafer. Furthermore, when the RF bias is not applied as shown in FIG. 6, the etching rate for the resist film is increased at the edge portion of the wafer.

This means that if ashing with an RF bias applied is performed, the resist film can be removed most evenly in the wafer surface and selective side-etching at the edge portion of the wafer can be performed, and if the amount of RF bias applied is adjusted, the amount of side-etching at the edge portion of the wafer can be adjusted.

FIG. 19 is a graph illustrating differences between in line width dimensions before and after the work of removing (ashing) the lower resist layer 4. In FIG. 19, the numerical values of the horizontal axis are sample numbers. For example, "1" of the center portion indicates the same sample as "1" of the edge portion.

As shown in FIG. 19, it is understood that if an RF bias is applied, the difference in line width dimension between the center portion and the edge portion of the wafer can be significantly improved (from about 3 nm to about 1 nm) as compared with the case of FIG. 8 where no RF bias is applied.

For convenience of description, radicals generated are fluorine (F) radicals, but this embodiment is not limited to this. As described above, the kind and ratio of radicals generated change depending on components of reaction products deposited. For example, when reaction products including more carbon atoms are deposited, removal of the oxide film is suppressed by decomposition and dissociation of the reaction products. Also in such a case, the embodiment of the invention is able to adjust the amount of side-etching by adjusting the amount of RF bias applied.

Next, it will be described to remove the influence, which is described as the third cause, of the reaction products 15 left (deposited) after the work of removing (ashing) the lower resist layer 4.

The inventor has found out, as the result of study, that if a deposition state such as the amount and distribution state of the reaction products 15 left (deposited) on the upper electrode 10 is adjusted after the wafer W has been carried out of the chamber 9, the accuracy of line width dimensions of a wafer W to be etched next and the uniformity in the wafer surface of the line width dimensions can be increased.

It is desirable to use an oxygen gas, a CH gas, a CO gas, or the like, because, if these gases are used, fluorocarbon components of reaction products left (deposited) can be removed and exhausted as CO or COF.

Figure 20:
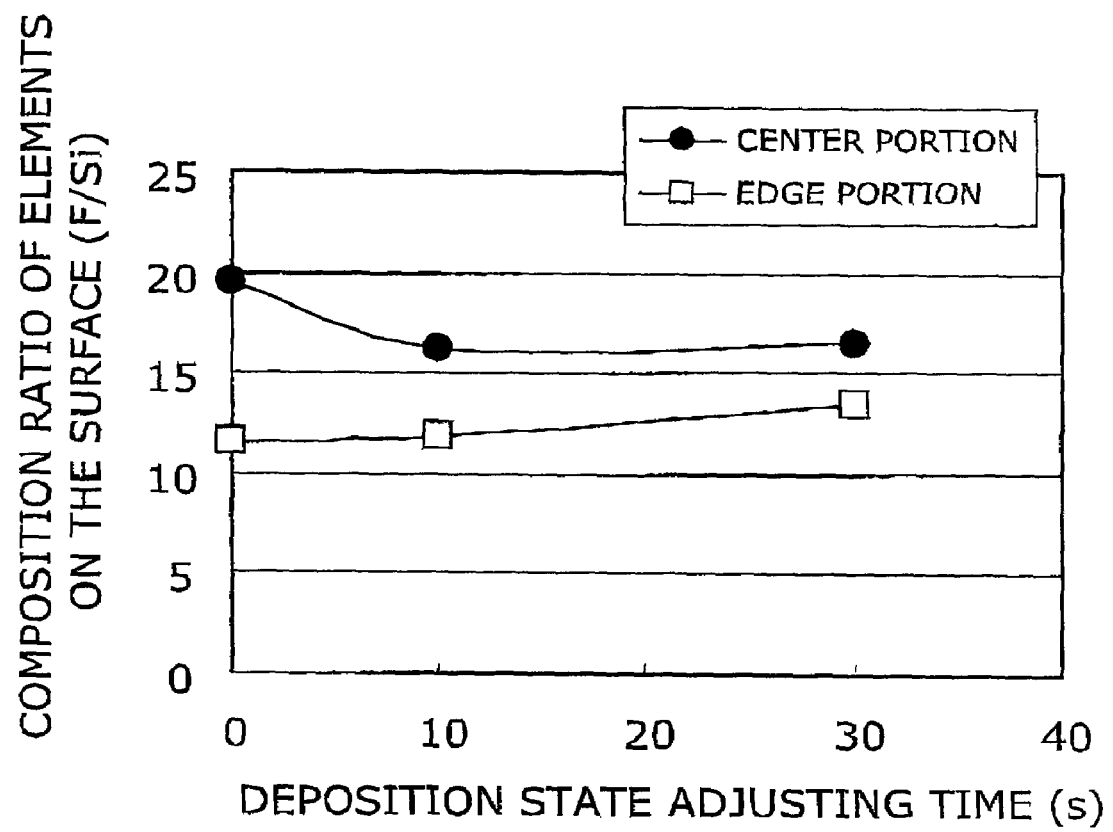
FIG. 20 is a graph illustrating the relation between a deposition state adjusting time and an amount of left (deposited) reaction products.

FIG. 20 is a graph illustrating the relation between the deposition state adjusting time and the amount of left (deposited) reaction products 15. The horizontal axis indicates the deposition state adjusting time, and the vertical axis indicates the composition of reaction products 15 left (deposited).

The measurement was performed by sticking silicon (Si) chips on the center portion and the edge portion (in a position about 10 mm distant from the edge) of the upper electrode 10 and analyzing the composition of reaction products 15 stuck on the silicon (Si) chips by an X-ray photoelectron spectroscopy (XPS) before the deposition state is adjusted. Table 4 shows the composition of reaction products 15 after adjustment for 30 seconds.

TABLE 4

|  | Center | Edge |  | Center | Edge |
|---|---|---|---|---|---|
| F | 10.6 | 7.9 | F/Si | 16.0 | 12.6 |
| C | 8.5 | 7.7 | C/Si | 12.9 | 12.3 |
| O | 47.3 | 46.9 | O/Si | 71.2 | 75.1 |
| Si | 33.6 | 37.6 |  |  |  |
| F/C | 1.24 | 1.03 | F/C | 1.24 | 1.03 |

As shown in FIG. 20, the longer the adjustment time becomes, amounts of fluorine (F) atoms left (deposited) on the center portion and the edge portion of the upper electrode 10 get closer to each other. This means that the distribution of reaction products left (deposited) on the upper electrode 10 is made uniform.

Concrete processing conditions in FIG. 20 are, for example, the oxygen gas flow rate of 1800 sccm, the HF/LF of 2000 W/0 W, the process pressure of 166 Pa (800 mTorr), and the processing time of 10 to 30 seconds.

Figure 21:
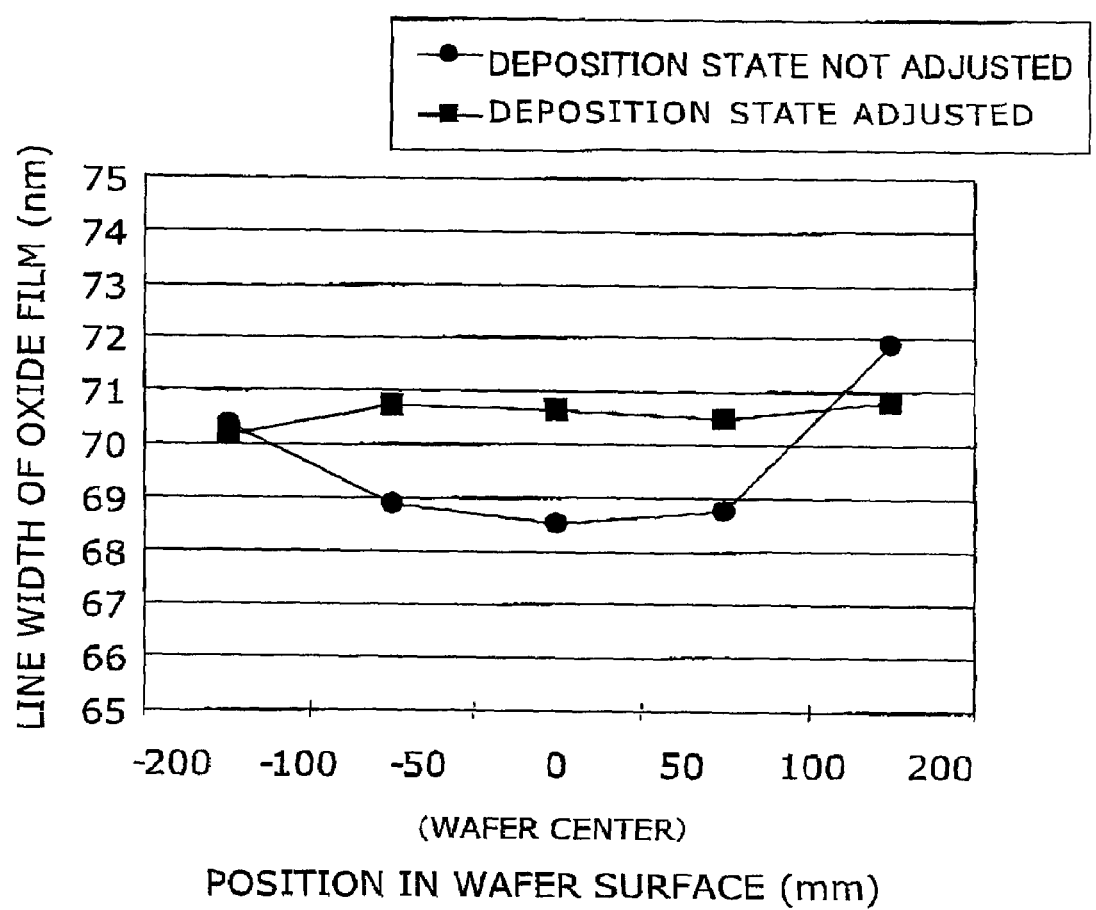
FIG. 21 is a graph illustrating the influence of adjustment of a deposition state on the uniformity in the surface of a wafer of line width dimensions.

FIG. 21 is a graph illustrating the influence of adjustment of the deposition state on the uniformity in the wafer surface of the line width dimensions. The horizontal axis indicates the position in the wafer surface, and the vertical axis indicates the line width of the oxide film 5. In the graph, "DEPOSITION STATE NOT ADJUSTED" represents line widths when a next wafer has been dry-etched without performing the aforementioned adjustment, and "DEPOSITION STATE ADJUSTED" represents line widths when a next wafer has been dry-etched after performing the aforementioned adjustment. The adjustment time was set to 30 seconds.

As understood from FIG. 21, in the case of "DEPOSITION STATE NOT ADJUSTED", the difference in line width dimension between the center portion and the edge portion of the wafer is 3.4 nm, while in the case of "DEPOSITION STATE ADJUSTED", the difference in line width dimension can be reduced to 0.7 nm. This means that the uniformity in the wafer surface of the line width dimensions can be increased along with the accuracy of the line width dimensions.

Figure 22:
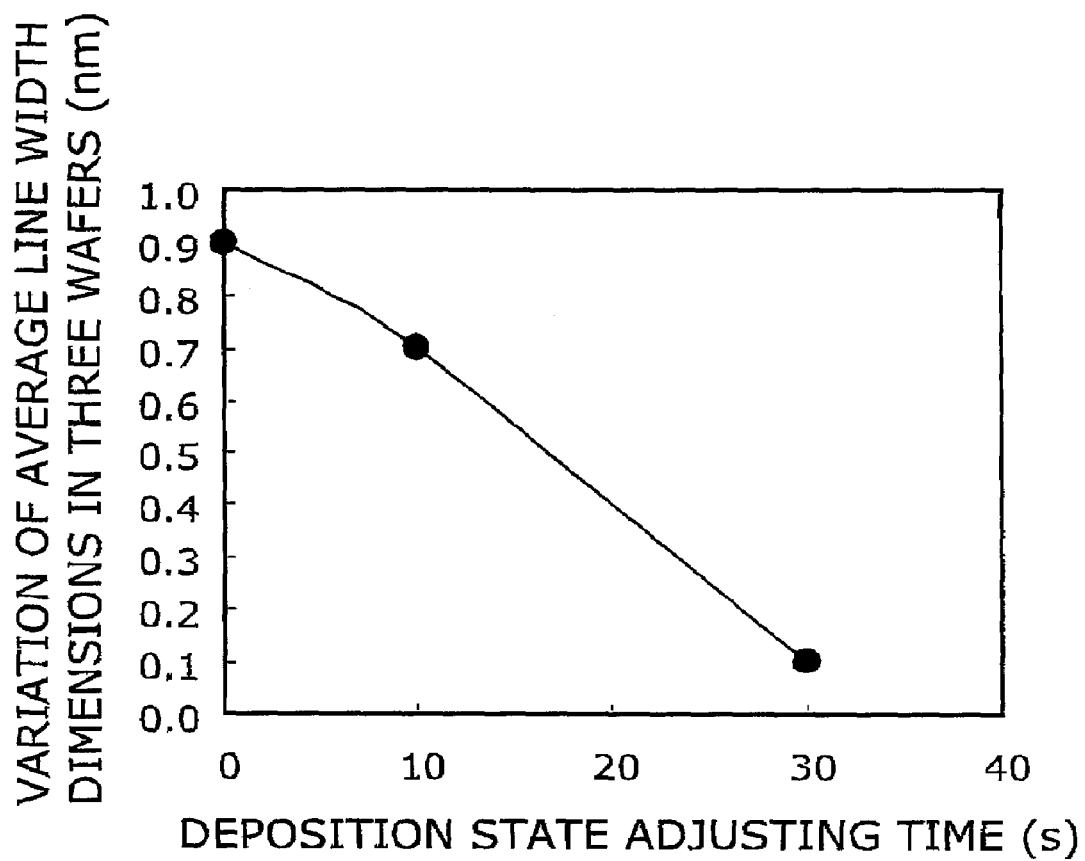
FIG. 22 is a graph illustrating the influence of adjustment of a deposition state on variations of line width dimensions between wafers.

FIG. 22 is a graph illustrating the influence of adjustment of a deposition state on variations of line width dimensions between wafers. The horizontal axis indicates the deposition state adjustment time, and the vertical axis indicates the variation of average line width dimensions in three wafers.

As shown in FIG. 22, it is understood that the longer the deposition state adjustment time becomes, the variation becomes smaller, and line widths of the oxide film 5 are thus made more uniform among the wafers. This means that the qualities among manufacturing lots can be increased.

As described above, according to this embodiment, the accuracy of line width dimensions of an oxide film and the uniformity in the wafer surface of them can be increased by adjusting a deposition state such as the amount and distribution state of reaction products 12 deposited on the upper electrode 10 during etching of the oxide film mask.

Furthermore, it becomes possible to adjust line width dimensions of the oxide film during ashing by using reaction products 14 deposited on the upper electrode 10 during etching of the oxide film, and the accuracy of the line width dimensions and the uniformity in the wafer surface of them can be thus increased.

Furthermore, by adjusting a deposition state such as the amount and distribution state of reaction products 15 left (deposited) on the upper electrode 10 after carrying out the wafer, the accuracy of line width dimensions of the oxide film of a wafer dry-etched next and the uniformity in the wafer surface of the line width dimensions can be increased.

Furthermore, according to this embodiment, a conventional lithography process can be added without modification. For this reason, new line width dimension controller can be added to line width dimension control made by a conventional lithography process, so that the accuracy of the line width dimensions and the uniformity in the wafer surface of them can be significantly increased.

Furthermore, this embodiment is particularly effective in such a case that a plurality of laminated films including oxide films and organic materials (resists) are continuously etched in the same chamber at once, thereby significantly increasing the accuracy of line width dimensions and the uniformity in the wafer surface of them.

For convenience, the case is exemplified when performing all of: deposition state adjustment performed after etching of an oxide film mask related to the first cause; ashing performed using reaction products deposited by etching of an oxide film related to the second cause; and deposition state adjustment performed after carrying out a wafer related to the third cause. However, it is not always necessary to perform all of them, and each of them may be performed alone or in combination with each other. Also in such a case, respective effects of the deposition state adjustments can be enjoyed. However, the larger the number of combinations becomes, the effects become larger.

In this embodiment, it also becomes possible to provide a reliable semiconductor device by adjusting line width dimensions and the uniformity in the wafer surface of them as described above.

Next, another embodiment of this invention will be described, in which the influence of the reaction products deposited in the chamber is monitored during etching any one of stacked films, and the feedback or the feed forward control is conducted on the basis of the results.

As previously described with regard to FIG. 1 through FIG. 22, one big factor influencing the dimension and the size of patterns formed on the wafer by etching includes the amount of deposits (reaction products involved in reactions) on the inner wall of the chamber to be etched. There exist, for example, reaction products adhered to the upper electrode 10 (See FIG. 1) and the wafer surface or the like, and these depend on strongly surface conditions (surface temperature, surface roughness, composition or the like) of the upper electrode and the wafer. Conventional observations of the intensities of plasma emission lines including part of compositional elements of the film to be processed and/or the underlying film for detecting the interface of each film constituting the stacked film do not include much information of deposits in the chamber, therefore differences among processing devices with regard to dimensions and shapes, fluctuations within a lot and variations with time are produced.

As an example, process of the lower resist layer 4 after process the oxide film 3 in the stacked mask structure being comprised of the upper resist layer 2, the oxide film 3 and the lower resist layer 4 as shown in FIG. 1 will be described. In this case, as previously described, deposits containing CFx remain in the chamber after processing of the oxide film 3. The deposited CFx dissociates during the process of the lower resist layer 4, F (fluorine) radical sandwiches the oxide film 3 and dimensions dwindle. The amount of residual F radical changes with the condition of the inner wall of the chamber such as the upper electrode 10, and dimension dwindling varies in response to the condition. Since the amount of the residual fluorine is influenced by variations with time in the chamber and device differences, it is becoming hard to control dimension changes influencing device characteristics only by the conventional end point detection of each film and/or chamber cleaning.

In contrast, in the embodiment, information (plasma emission intensity or the like) about the residual amounts of elements comprising deposits in the chamber is obtained during etching any one of films comprising the stacked film or during cleaning deposits in the chamber. And then, on the basis of it, feedback and/or feed forward control of etching and cleaning in other step are conducted. As a result, differences among wafers with regard to dimensions and shapes and differences among devices can be reduced. Further, dependence on cumulative discharge time and differences among products (difference of resist cover ratio) can be reduced.

Figure 23:
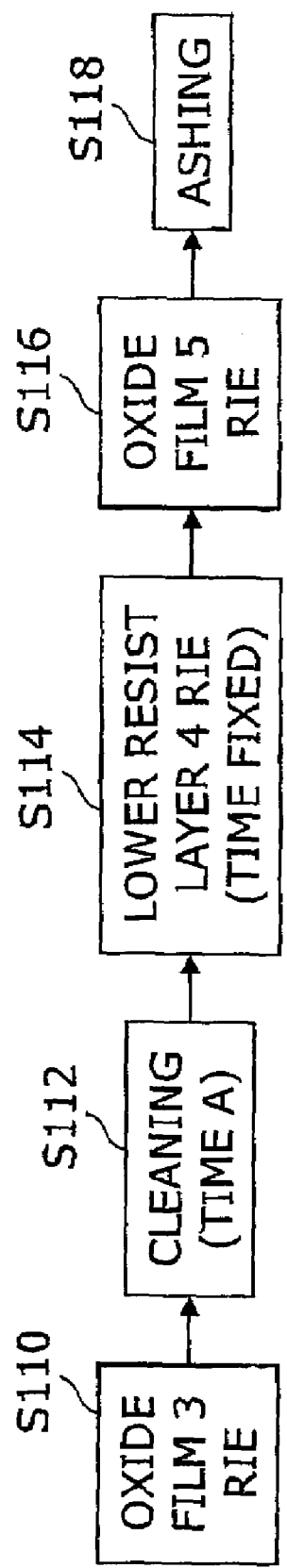
FIG. 23 is a schematic view illustrating a process flow of dry-etching the wafer W having the stacked mask 1 illustrated in FIG. 1.

FIG. 23 is a schematic view illustrating a process flow of dry-etching the wafer W having the stacked mask 1 illustrated in FIG. 1.

At first, the oxide film 3 is etched by RIE using the upper resist layer 2 as a mask (Step S110). Next, as previously described with regard to FIG. 1C, a cleaning for adjusting the deposition state of reaction products deposited in the chamber (hereinafter, merely 'cleaning' is referred) is conducted (Step S112). The cleaning can be conducted using at least any one of oxygen ion, oxygen radical, hydrogen ion, hydrogen radical and oxygen radical or the like as described previously. Furthermore, gases including CH or CO can be added as described previously. In this way, the amount of deposits such as CFx deposited in the chamber after processing the oxide film 3 can be adjusted.

Thereafter, the lower resist layer 4 is etched by RIE (Step S114). Using the stacked mask formed like this, the oxide film 5 is etched and the specified pattern is formed (Step S116). After that, the lower resist layer 4 is removed by ashing (Step S118).

In the process like this in the embodiment, feedback or feed forward control is conducted.

Figure 24:
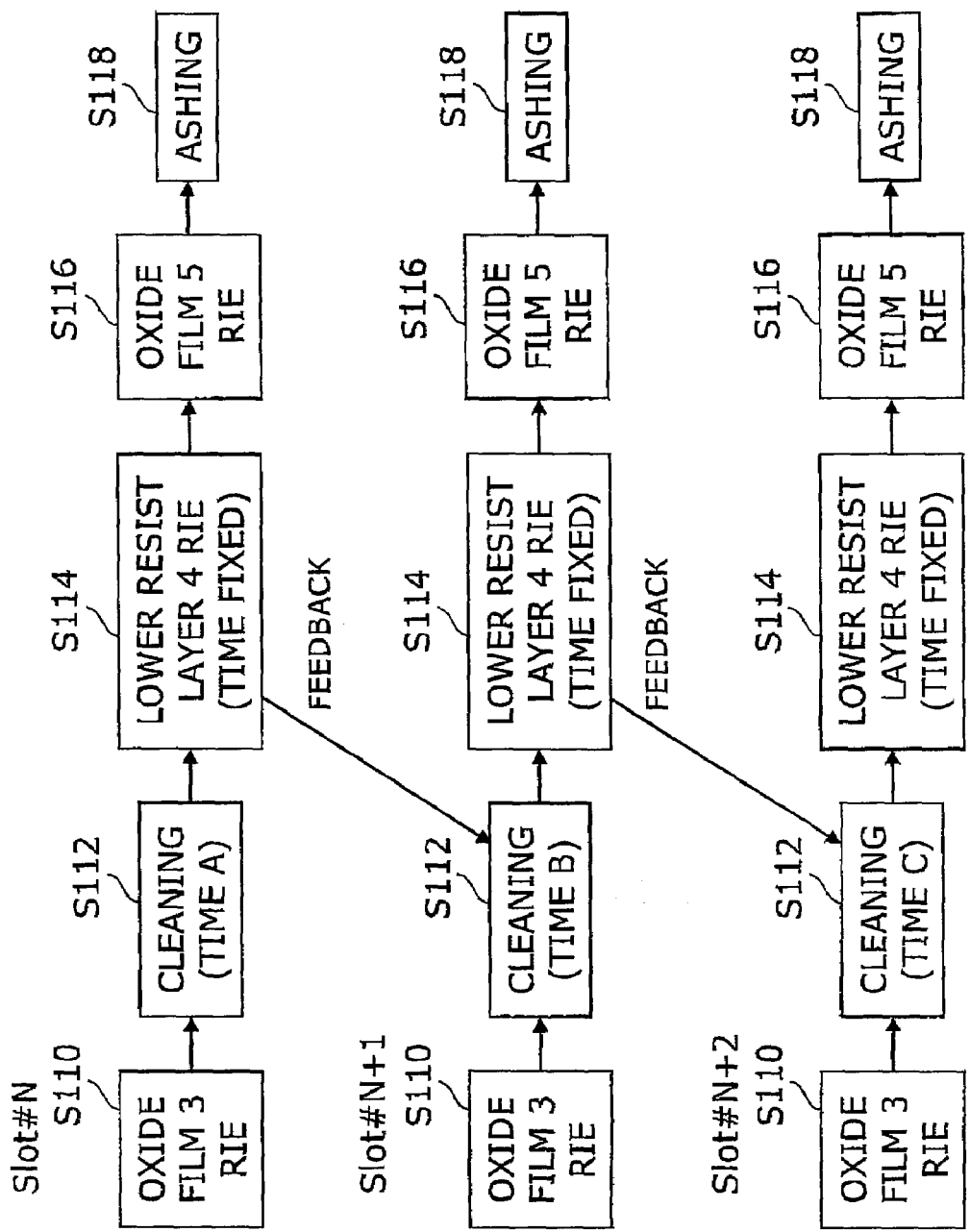
FIG. 24 is a schematic view illustrating a process flow in conduct of the feedback control.

FIG. 24 is a schematic view illustrating a process flow in conduct of the feedback control.

At first, in the nth slot, etching of the oxide film 3 (Step S110), cleaning (Step S112), etching of the lower resist 4 (Step S114), etching of the oxide film 5 (Step S116), ashing (Step S118) are conducted. At this time, as previously describe, in the etching step of the lower resist layer 4 (Step S114), the amount of residual deposits including CF in the chamber influence strongly concrete dimensions. Then, the emission intensity from CFx usually not observed is observed during etching of the lower resist layer 4. If the correlation relationship between the emission intensity of CF and the concrete dimensions is known, the feedback to the cleaning condition in the next (N+1)th slot (Step S112) is conducted so as to maintain the constant CF intensity. Specifically, for example, the feedback of cleaning time is conducted. In this way, differences among wafers with regard to dimensions and shapes and differenced among devices can be reduced. Further, dependence on cumulative discharge time and differences among products (difference of resist cover ratio) can be reduced.

Here, by detecting an end point of CFx emission in the simple cleaning (Step S112), the residual amount of CFx in etching of the next lower resist layer 4 (Step S114) can also be controlled in the specified range. However, in the cleaning (Step S112), conditions giving no damage to wafers, for example, high pressure and low power, are necessary and a short treatment time is needed. As a result, an emission intensity of the plasma and a time enough for the end point detection may not be obtained.

In contrast, in the embodiment, the influence by reaction products deposited in the chamber can be investigated based on the emission intensity of CFx in the etching of the lower resist layer 4 (Step S114). On the basis of the result, the feedback control is conducted to conditions in the next cleaning and the followings (Step S112). For example, when the emission intensity of CFx is large in the etching of the lower resist layer 4 (Step S114), cleaning times in the next cleaning and the followings are prolonged. On the other hand, when the emission intensity of CFx is small in the etching of the lower resist layer 4 (Step S114), cleaning times in the next cleaning and followings are shortened. In this way, the influence by deposits in the chamber can be maintained within the specified range, and fluctuation of dimensions and shapes among wafers can be suppressed.

On the other hand, in the embodiment, feed forward control is also possible.

Figure 25:
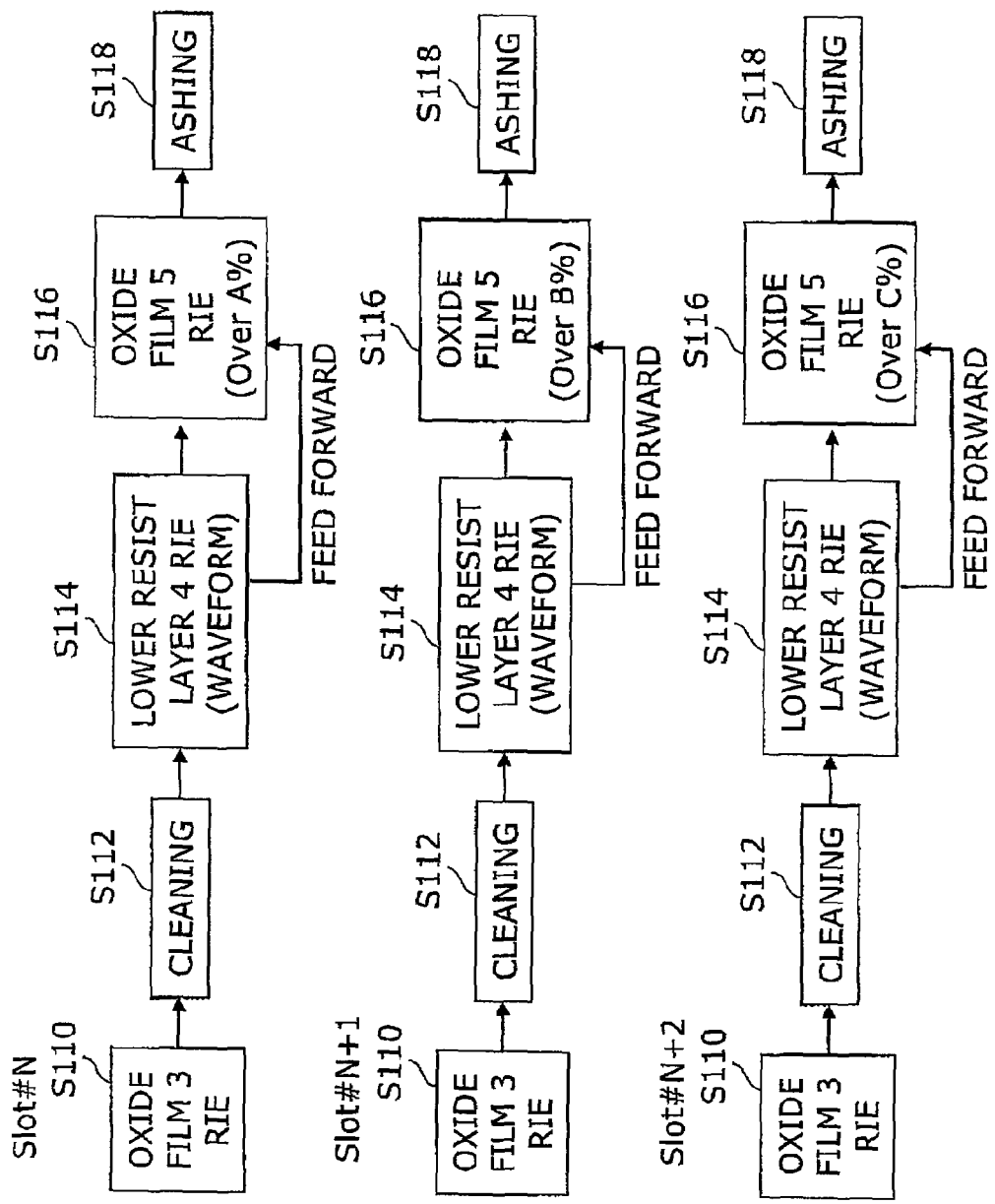
FIG. 25 is a schematic view illustrating a process flow in conduct of feed forward control.

FIG. 25 is a schematic view illustrating a process flow in conduct of feed forward control. That is to say, in the etching of the lower resist layer 4 (Step S114), information about the residual amount of reaction products deposited in the chamber is obtained. And then, on the basis of results, the feed forward control is conducted to Conditions in next etching of the oxide film 5 (Step S116).

For example, if the correlation relationship between the emission intensity of CFx observed during the etching of the lower resist layer 4 (Step S114) and the concrete dimensions after the etching of the oxide film 5, the concrete dimensions can be corrected by adjusting the etching time of the etching of the oxide film 5 (Step S116). Moreover, a flow rate of etching gases and compositions can be adjusted in stead of adjusting the etching time of the oxide film 5.

Hereinafter, the feedback control and the feed forward control in the embodiment will be described in detail with reference to examples.

Here, patterning the wafer having the stacked film shown in FIG. 1 using the process shown in FIG. 23 will be described. In this case, the etching of the oxide films 3, 5 (Step S110, S116) can be conducted using gases including CFx, the cleaning (Step S112) can be conducted by gases including properly $O_2$, CO, $N_2$ or the like and the process of the lower resist layer 4 (Step S114) can be conducted by gases including $O_2$, $N_2$, CO or the like.

Figure 26:
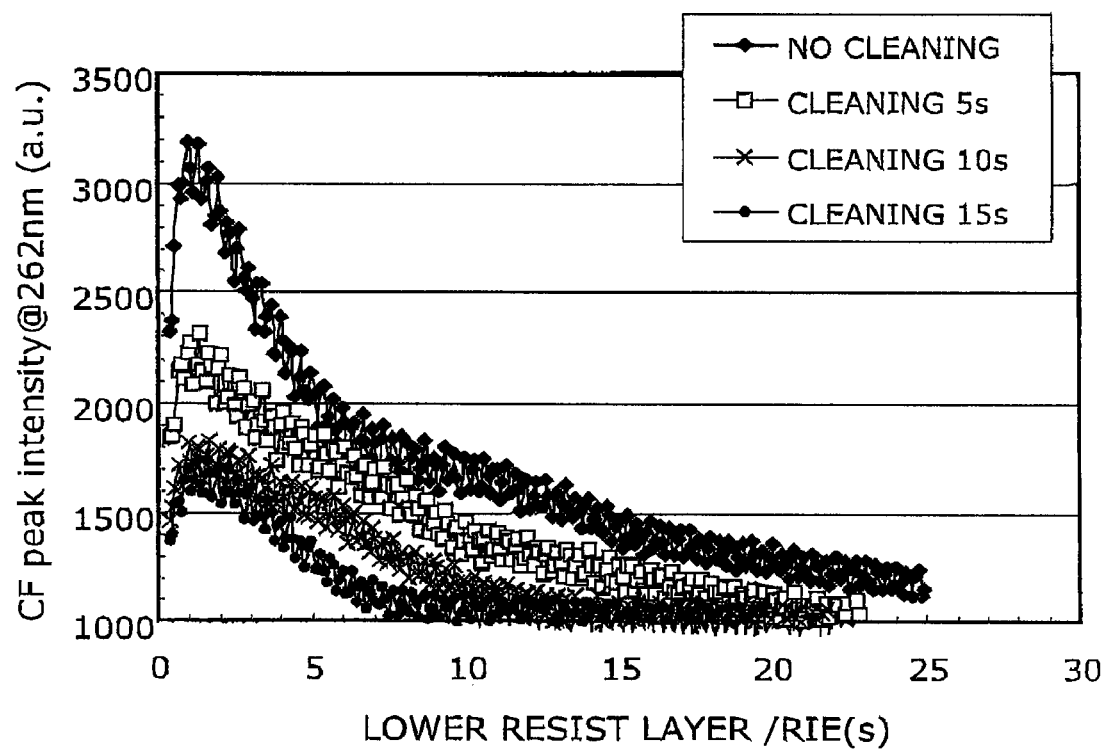
FIG. 26 is a graph illustrating a time dependence of the plasma emission intensity of CFx during the process of the lower resist layer 4.

FIG. 26 is a graph illustrating a time dependence of the plasma emission intensity of CFx during the process of the lower resist layer 4. Here, the horizontal axis indicates an elapsed time from the start of the processing of the lower resist layer 4 (Step S114). And an emission near a wave length of 262 nm is observed for the plasma emission of CFx.

Moreover, FIG. 26 shows four cases with different cleaning times (Step S112) conducted before the process of the lower resist layer 4 (Step S114). That is, cases of the cleaning time, zero (no cleaning), 5 seconds, 10 seconds, 15 seconds, are shown, respectively. It is clear that the longer the cleaning time, the smaller the peak intensity of CF plasma emission during the process of the lower resist layer 4 (Step S114). That is, it is clear that the longer the cleaning time, the more the residual deposit of CFx in the chamber (including on the wafer surface) removed.

Figure 27:
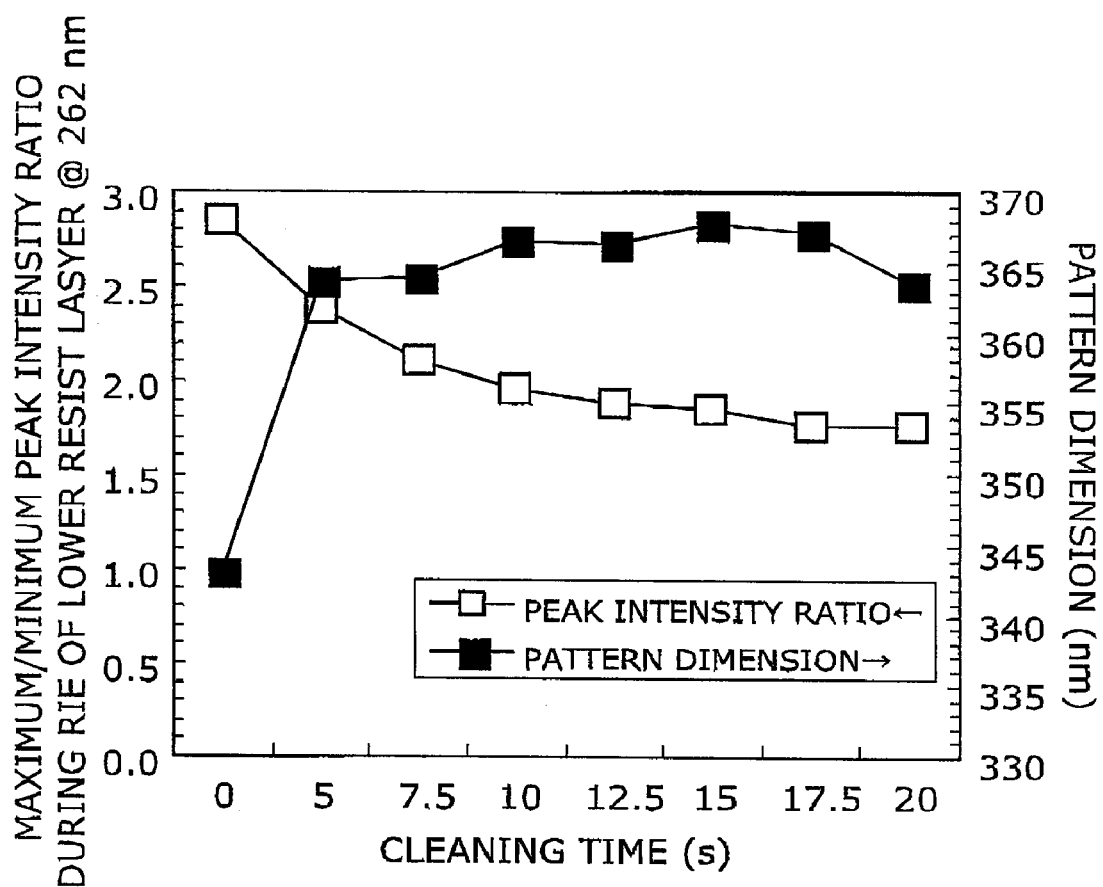
FIG. 27 is a graph illustrating a cleaning time dependences of the maximum/minimum peak intensity ratio of the CF plasma emission as shown in FIG. 26 and pattern dimensions after the processing.

FIG. 27 is a graph illustrating a cleaning time dependences of the maximum/minimum peak intensity ratio of the CF plasma emission as shown in FIG. 26 and pattern dimensions after the processing.

As shown in FIG. 26, the maximum peak intensity of the CF plasma emission appears at 1 to 2 seconds after the start of the etching of the lower resist layer 4. On the other hand, the minimum peak intensity is defined as the peak intensity at the end of the etching of the lower resist layer 4 in respective curves indicated in FIG. 26. Moreover, the pattern dimensions after the processing are obtained by measuring the pattern dimensions of the oxide film 5.

As shown in FIG. 27, when the cleaning time is less or equal to 5 seconds, the maximum/minimum peak intensity ratio of the CF emission is large and the concrete pattern dimensions are small. On the other hand, when the cleaning time is more than 5 seconds, the maximum/minimum peak intensity ratio of the CF emission decreases and the pattern dimensions have a tendency to increase and stabilize. In a short cleaning time, residual deposits of CFx can not be fully removed, on the contrary, with a too long cleaning time, there is a fear of dimension dwindling and pattern isolation by the side etching of the lower resist layer 4 during the cleaning.

In the specific example, for example, the cleaning time of 15 seconds can be assumed to be the center condition as the condition which a broad process margin can be assured and the pattern dimensions are maximized. In this case, 1.85 being the maximum/minimum peak intensity ratio at the cleaning time of 15 seconds is taken to be the center value.

Dimension correction can be performed using the correlation between the cleaning time obtained from FIG. 27 and the maximum/minimum intensity ratio of the CF emission peaks during RIE of the lower resist layer.

Figure 28:
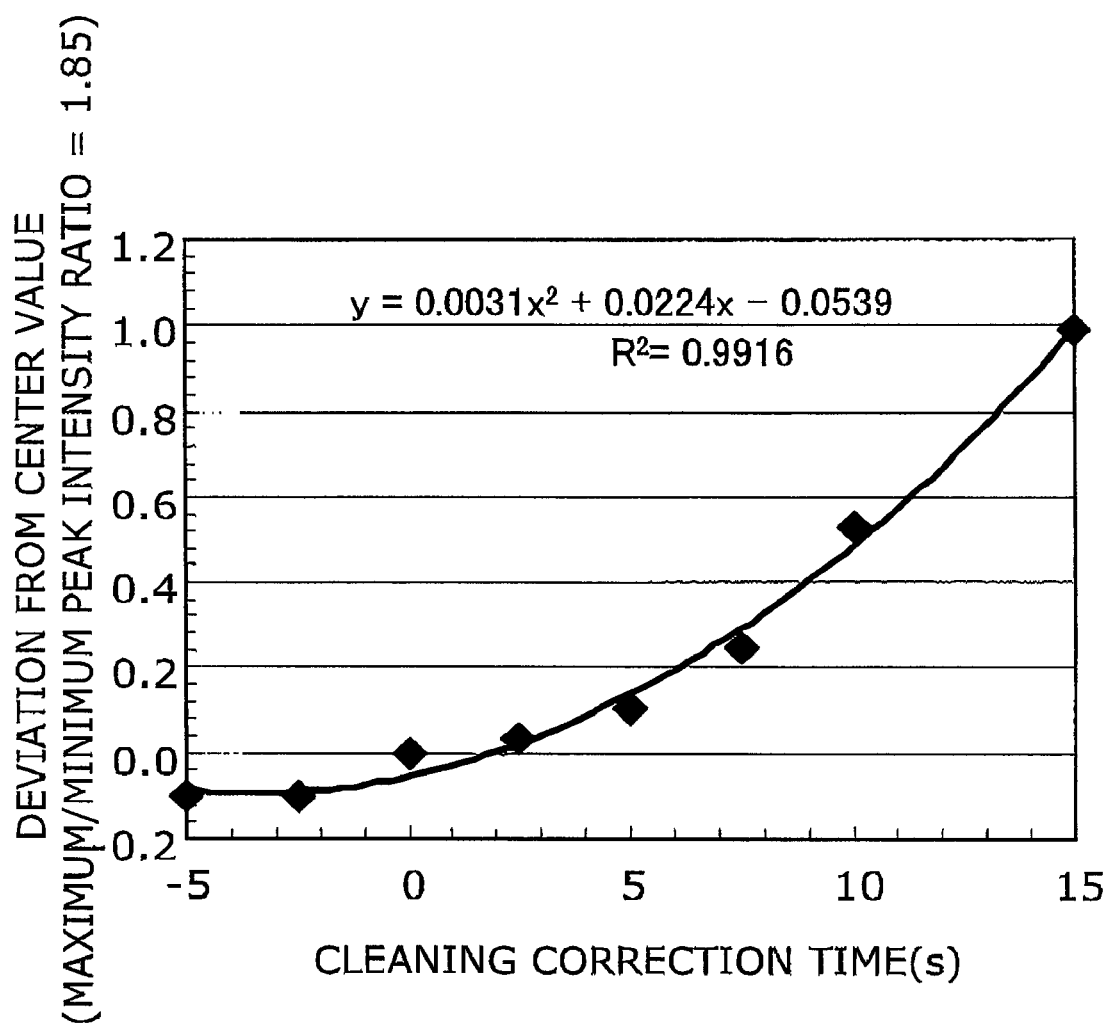
FIG. 28 is a graph illustrating the amount of correction of the cleaning time necessary for correcting disagreement from the center value (most optimum value is 1.850) of the maximum/minimum peak intensity read from FIG. 27.

FIG. 28 is a graph illustrating the amount of correction of the cleaning time necessary for correcting disagreement from the center value (most optimum value is 1.850) of the maximum/minimum peak intensity read from FIG. 27.

For the process operated on the cleaning time of 15 seconds, for example, when the maximum/minimum peak intensity ratio of the CFx plasma emission during the process of the lower resist layer 4, the next cleaning time is not corrected and the cleaning is conducted for the time as set.

On the other hand, for example, the maximum/minimum peak intensity ratio of the CF plasma emission during the process of the lower resist layer 4 is assumed to increase to 1.95. In other words, a deviation of plus 0.1 from 1.85 being the center value is assumed. In this situation, the cleaning time is increased by plus 3 seconds to correct the deviation of plus 0.1. That is, the cleaning time is taken to be 18 seconds in the next cleaning (Step S112). This means that the residual CFx is reduced by increasing the cleaning time on the basis of the increase of the CFx plasma emission intensity observed during the process of the lower resist layer 4.

In this way, on the basis of information of the CFx plasma emission intensity observed during the process of the lower resist layer 4, the amount of the residual CFx in the chamber is estimated and the feedback to the next cleaning is performed. As a result, the amount of the residual CFx in the chamber can always be controlled in the specified range and the concrete dimension of the pattern can also be maintained in the specified range.

Figure 29:
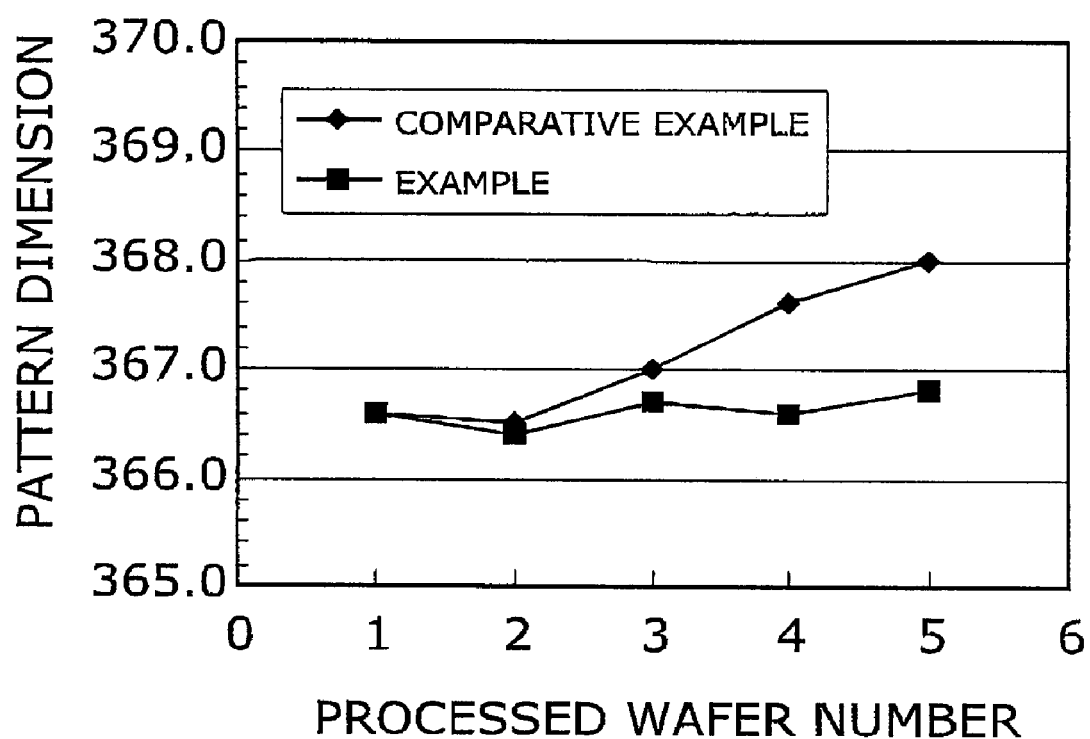
FIG. 29 is a graph illustrating a result controlled by the feedback based on the embodiment.

FIG. 29 is a graph illustrating a result controlled by the feedback based on the embodiment. That is to say, the vertical axis of FIG. 29 shows the number of processed slot and the horizontal axe shows the concrete pattern dimension of the oxide film 5 in each wafer.

In the comparative example without the feedback control, a tendency of increase of the pattern dimension is observed in response to the progress of processed slot. It is considered that this is because the amount of residual CFx on the inner wall of the chamber and on the wafer may decrease in response to the progress of the processed slot as the cleaning effect becomes greater. On the contrary, in the example with the feedback control based on the embodiment, the concrete pattern dimension is constant and stable in spite of the progress of processed slot. In other words, it is clear that the influence of the residual CFx or the like is corrected and dimensions are controlled.

Figure 30:
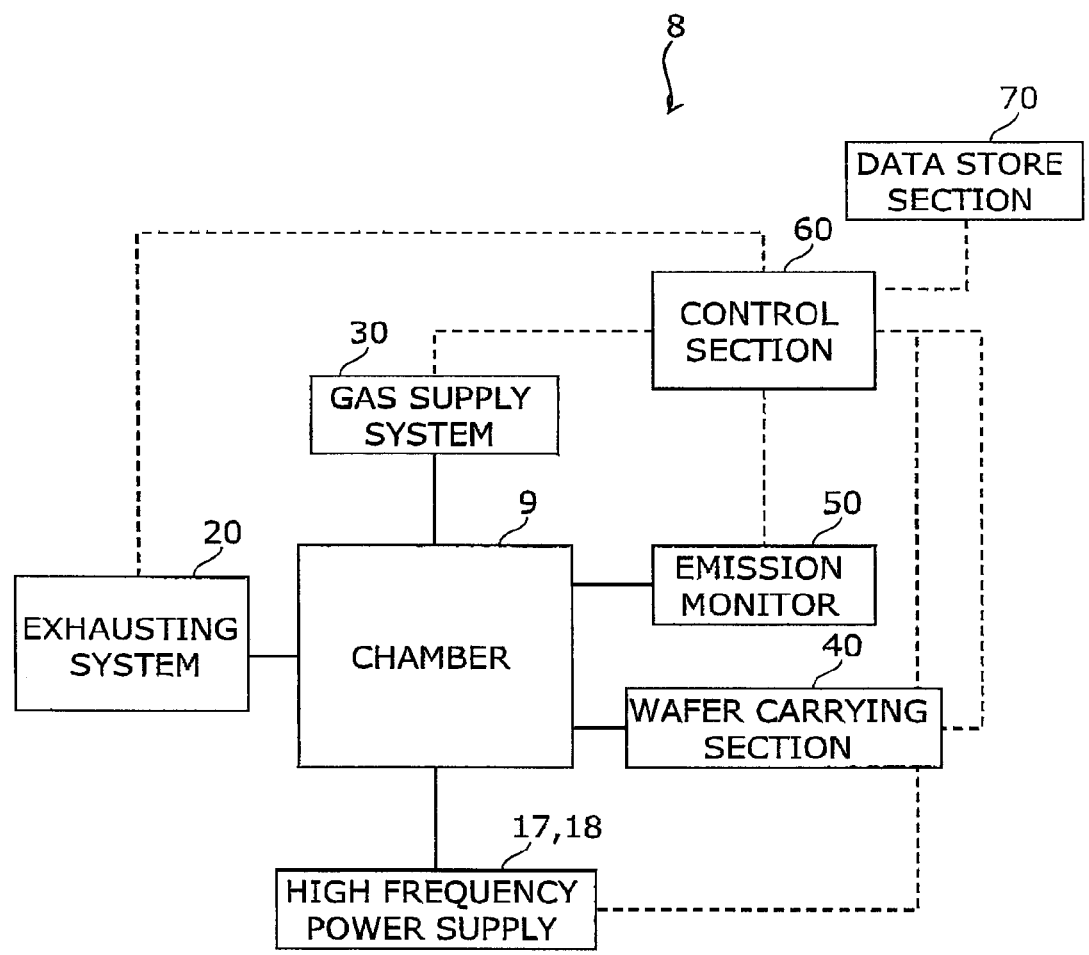
FIG. 30 is a block diagram of the etching apparatus according to the embodiment.

FIG. 30 is a block diagram of the etching apparatus according to the embodiment.

This etching apparatus has a chamber 9 in which a wafer as the body to be processed can be held. The inner space of the chamber 9 can be maintained to a reduced pressure by an exhausting system 20. And then, a specified gas atmosphere of a specified pressure can be formed by introducing a specified gas from a gas supply system 30. Formation of plasma in the chamber 9 is possible by introducing radio frequency from high frequency power supplies 17, 18. Moreover, a wafer can be carried in and out the chamber 9 by a wafer carrying section 40. And then a emission monitor 50 is attached to the chamber 9 and the plasma emission can be measured.

A control section 60 controls operation of each element and further controls process based on results observed by the emission monitor 50. Moreover, a data store section 70 stores a data base for the feedback control or the feed forward control. For example, the data base includes the data of correlation between the deviation of the emission peak intensity ratio illustrated in FIG. 28 and the cleaning correction time. The control section 60 conducts properly the feedback control or the feed forward control based on the database stored in the data store section 70.

By the way, the data store section 70 does not always need to be provided integrally with the etching apparatus 8. For example, when there is a host computer controlling lines of a semiconductor manufacturing plant, the data store section 70 may be provided as a part of the data base controlled by the computer. In this situation, the data store section 70 can be provided apart from the etching system 8 and can supply the specified data to the control section 60 through a wire, wireless or recording media.

Figure 31:
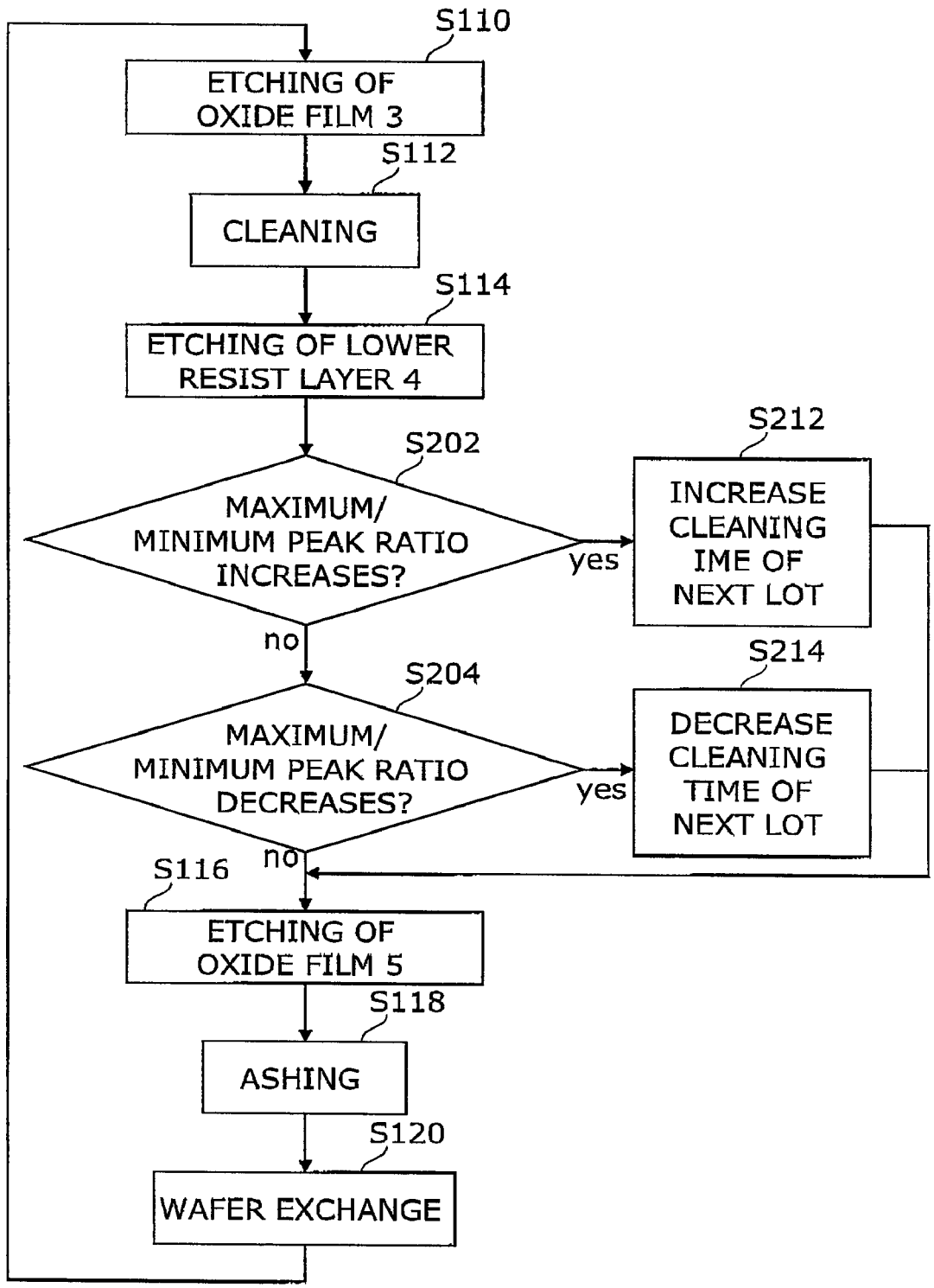
FIG. 31 is a flow chart illustrating the feedback control conducted in the etching apparatus of the embodiment.

FIG. 31 is a flow chart illustrating the feedback control conducted in the etching apparatus of the embodiment.

The wafer is carried in the chamber 9 by the wafer carrying section, then the chamber 9 is evacuated by the exhausting system 20 and the specified gas in introduced from the gas supply system 30. The specified plasma is produced by applying radio frequency from the high frequency power supplies 17, 18.

At first, the oxide film 3 is etched using the upper resist layer 2 (See FIG. 1) as a mask (Step S110). Next, a gas introducing to the chamber 9 is replaced by the gas supply system 30 and the cleaning for adjusting a deposited state of reaction products deposited in the chamber is conducted (Step S112). Thereafter, a gas introducing to the chamber is replaced again by the gas supply system and the lower resist layer 4 is etched (Step S114).

In this step, as previously described with regard to FIG. 26, the CFx plasma emission intensity is measured by the emission monitor 50. Then, when the maximum/minimum peak intensity ratio increases above the center value (Step S202: yes), the next cleaning time is increased (Step S212) as previously described with regard to FIG. 26 to FIG. 29. At this time, the control section 60 refers properly to the data stored in the data store section 70. On the other hand, when the maximum/minimum peak intensity ratio decreases below the center value (Step S204:yes), the next cleaning time is decreased as previously described with regard to FIG. 26 to FIG. 29 (Step S214). Also at this time, the control section 60 refers properly to the data stored in the data store section 70.

Thereafter, the oxide film 5 is processed and the specified pattern is formed (Step S116). After that, the lower resist layer 4 is removed by ashing (Step S118), the processed wafer is carried out the chamber 9 by the wafer carrying section 40 and the next slot wafer is introduced into the chamber 9 (Step S120).

And then, after etching the oxide film 3 (Step S110), the new wafer is cleaned (Step S112). At this time, if the cleaning time is increased (Step S212) or decreased (Step S214) in the precedent slot, the control section 60 conducts the cleaning to reflect the correction. If the process like this is conducted, the feedback control of the cleaning time is possible in response to the amount of the residual CFx in the chamber 9, and the concrete dimension of the oxide film 5 can always be in the definite range.

Figure 32:
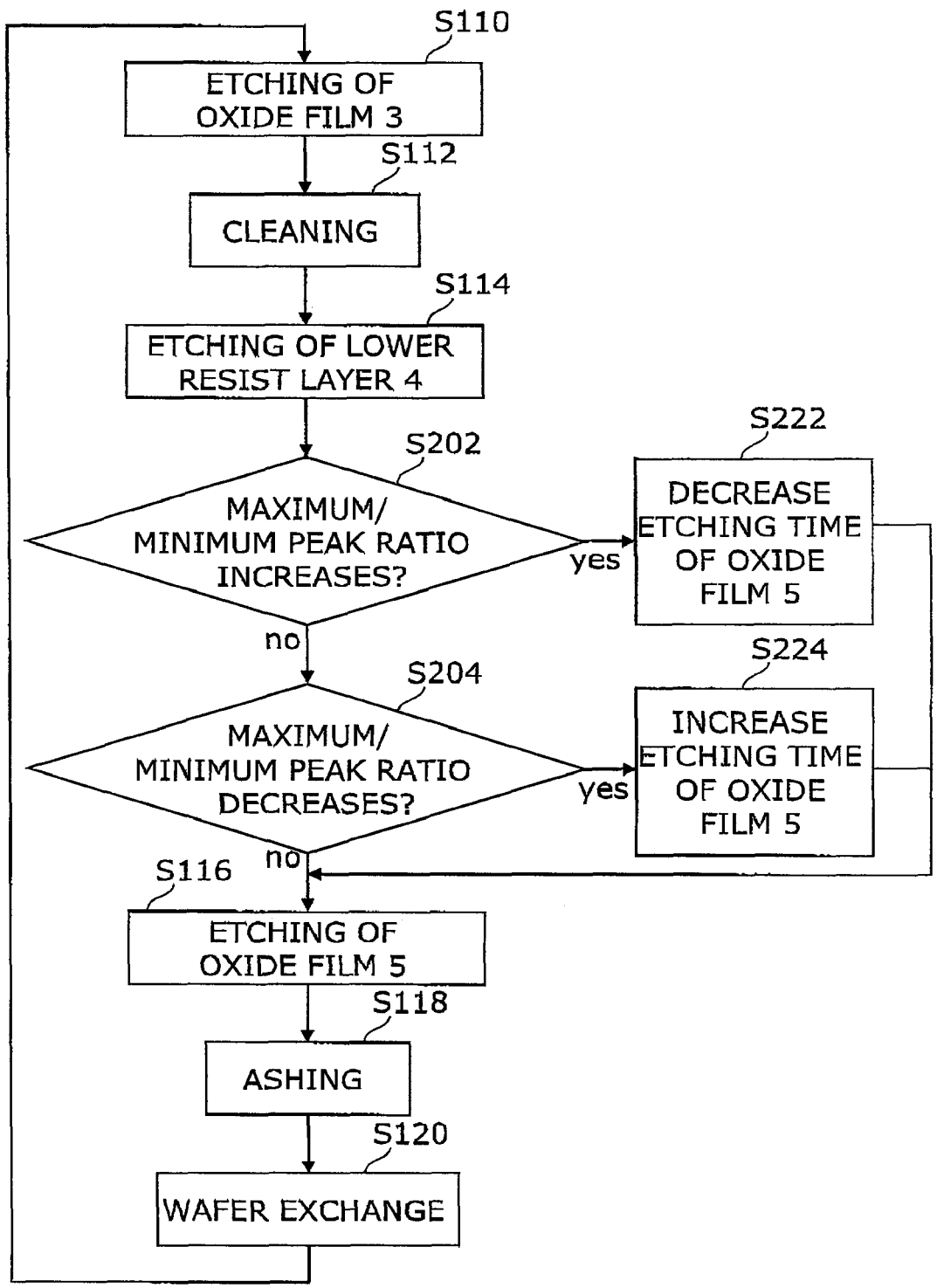
FIG. 32 is a flow chart illustrating the feed forward control conducted in the etching system of the embodiment.

FIG. 32 is a flow chart illustrating the feed forward control conducted in the etching system of the embodiment.

In the example, when the maximum/minimum peak intensity ratio of the CFx plasma emission increases above the center value (Step S202: yes) during the etching of the lower resist layer 4 (Step S114), the control section 60 decreases the next cleaning time of the oxide film 5 (Step S222). On the other hand, the maximum/minimum peak intensity ratio of the CFx plasma emission decreases below the center value (Step S204: yes) during the etching of the lower resist layer 4 (Step S114), the control section 60 increases the next cleaning time of the oxide film 5 (Step S224).

In this situation, for example, the data base of correlation between the maximum/minimum peak intensity ratio of the CFx plasma emission during the etching of the lower resist layer 4 and the optimum etching time for the concrete dimension of the oxide film 5 being a set point is stored in the data store section 70. The data base like this can be created based on results of experiments and trial productions performed in advance as well as the data base previously described with regard to FIG. 28. In other words, the data base may be renewed every conduct of the wafer process.

In this way, the feed forward control of the cleaning time of the oxide film 5 is possible in response to the amount of the residual CFx in the chamber 9 (including the wafer surface), and the concrete dimension can always be in the definite range.

Up to this point, the embodiment of the invention is described with reference to concrete example. However, the present invention is not limited to these concrete examples.

Design changes made to the aforementioned concrete examples as appropriate by those skilled in the art are also included in the scope of the present invention as long as they have features of the present invention.

For example, as the reactive ion etching (RIE) apparatus 8, a parallel plate type RIE apparatus is exemplified, however, the reactive ion etching (RIE) apparatus 8 is not limited to this. For example, a magnetron RIE apparatus, a triode RIE apparatus, a surface-wave plasma etching apparatus, a helicon-wave plasma etching apparatus, an induction coupled plasma etching apparatus, or the like may be used. In these cases, a component such as a dielectric window provided so as to face a wafer may be shown as an example corresponding to the upper electrode 10. Furthermore, for generation of the plasma, microwave power may be used instead of the high-frequency power.

Shapes, arrangement, sizes, materials, etc. of the chamber 9, upper electrode 10, high-frequency power supply 17, mounting bed 11, high-frequency power supply 18, etc. of the reactive ion etching (RIE) apparatus 8 are not limited to ones shown in the figures and may be changed or modified as appropriate.

Furthermore, as the laminated mask 1, three-layer one is shown as an example, but the number of layers is not limited to three and may be changed as appropriate.

Furthermore, as the oxide film, a $SiO_2$ film is shown as an example, but the oxide film is not limited to this, and a tetraethylorthosilicate (TEOS) film, a boron-silicate glass (BSG) film, a boron-phospho-silicate glass (BPSG) film, a coated oxide film, or the like may be selected as appropriate.

The invention claimed is:

1. A method of manufacturing a semiconductor device comprising:
   etching a first film provided on a wafer in a chamber;
   removing at least part of reaction products deposited on a component in the chamber facing the wafer by the etching to cause a distribution state of the deposited reaction products to get closer to a uniform state; and
   then etching a resist film provided on the wafer in the chamber.

2. The method of manufacturing a semiconductor device according to claim 1, wherein a gas containing $CH_4$ gas is used for removal of the reaction products, and an amount of the $CH_4$ gas added to the gas is 1 wt % or more and less than 8.3 wt %.

3. A method of manufacturing a semiconductor device according to claim 1 further comprising:
   removing at least part of reaction products deposited on the component in the chamber facing the wafer to cause a distribution state of the deposited reaction products to get closer to a uniform state after the wafer has been carried out of the chamber.

4. A method of manufacturing a semiconductor device according to claim 1, wherein
   etching the first film provided on the wafer in the chamber forms a pattern, the method further comprising:
   adjusting size of the pattern using radicals generated from reaction products, when a mask left on the pattern is removed, the reaction products having been deposited on the component in the chamber facing the wafer by the etching.

5. The method of manufacturing a semiconductor device according to claim 4, wherein the adjusting includes applying an RF bias to the wafer.

6. The method of manufacturing a semiconductor device according to claim 4, wherein the first film is a silicon oxide film.

7. A method of manufacturing a semiconductor device comprising:
   etching a first film provided on a wafer in a chamber;
   removing at least part of reaction products deposited in the chamber by the etching; and
   etching a resist film provided under the first film on the wafer,
   information regarding an amount of the reaction products deposited in the chamber being obtained in at least one of etching the first film, removing the reaction products and etching the resist film, and
   a feedback being conducted to at least one of etching the first film, removing the reaction products and etching the resist film in regard to a next wafer, based on the information.

8. The method of manufacturing a semiconductor device according to claim 7, further comprising etching a third film provided under the resist film on the wafer.

9. The method of manufacturing a semiconductor device according to claim 7, wherein the first film is made of silicon oxide.

10. The method of manufacturing a semiconductor device according to claim 7, wherein the information regarding an amount of the reaction products is obtained by measuring plasma emission.

11. The method of manufacturing a semiconductor device according to claim 7, wherein a gas containing $CH_4$ gas is used for removal of the reaction products, and an amount of the $CH_4$ gas added to the gas is 1 wt % or more and less than 8.3 wt %.

12. A method of manufacturing a semiconductor device comprising:
   etching a first film provided on a wafer placed in a chamber;
   removing at least part of reaction products deposited in the chamber by the etching;

etching a resist film provided under the first film on the wafer; and etching a third film provided under the resist film on the wafer, information regarding an amount of the reaction products deposited in the chamber being obtained in at least one of etching the first film, removing the reaction products and etching the resist film, and a feedforward being conducted to etching the third film.

13. The method of manufacturing a semiconductor device according to claim 12, wherein the third film is made of silicon oxide.

14. The method of manufacturing a semiconductor device according to claim 12, wherein the first film is made of silicon oxide.

15. The method of manufacturing a semiconductor device according to claim 12, wherein the information regarding an amount of the reaction products is obtained by measuring plasma emission.

16. The method of manufacturing a semiconductor device according to claim 12, wherein a gas containing $CH_4$ gas is used for removal of the reaction products, and an amount of the $CH_4$ gas added to the gas is 1 wt % or more and less than 8.3 wt %.

* * * * *